United States Patent
Sawada

(10) Patent No.: US 11,296,013 B2
(45) Date of Patent: Apr. 5, 2022

(54) SEMICONDUCTOR WAFER AND SEMICONDUCTOR DEVICE FOR SUPPRESSING THE PROPAGATION OF CRACKS

(71) Applicant: SOCIONEXT INC., Kanagawa (JP)

(72) Inventor: Toyoji Sawada, Yokohama (JP)

(73) Assignee: SOCIONEXT INC., Kanagawa (JP)

(*) Notice: Subject to any disclaimer, the term of this patent is extended or adjusted under 35 U.S.C. 154(b) by 0 days.

(21) Appl. No.: 17/103,887

(22) Filed: Nov. 24, 2020

(65) Prior Publication Data

US 2021/0166994 A1 Jun. 3, 2021

(30) Foreign Application Priority Data

Nov. 28, 2019 (JP) .............................. JP2019-215610

(51) Int. Cl.
*H01L 23/48* (2006.01)
*H01L 23/00* (2006.01)

(52) U.S. Cl.
CPC ............ *H01L 23/481* (2013.01); *H01L 24/05* (2013.01)

(58) Field of Classification Search
CPC ......... H01L 21/6836; H01L 2223/5446; H01L 23/481; H01L 24/05; H01L 23/48
See application file for complete search history.

(56) References Cited

U.S. PATENT DOCUMENTS

| 2003/0047794 A1 | 3/2003 | Watanabe |
| 2005/0082577 A1 | 4/2005 | Usui |
| 2006/0267222 A1 | 11/2006 | Saito |
| 2008/0237877 A1 | 10/2008 | Morikawa et al. |
| 2008/0258262 A1 | 10/2008 | Nagai |
| 2009/0225294 A1* | 9/2009 | Okano ................... G03F 9/7084 355/53 |

(Continued)

FOREIGN PATENT DOCUMENTS

| JP | 2003-086589 A | 3/2003 |
| JP | 2005-142553 A | 6/2005 |

(Continued)

OTHER PUBLICATIONS

Zhou-Jie Wu et al., "Chip-Package Interaction Challenges for Large Die Applications," 2018 IEEE 68th Electronic Components and Technology Conference, pp. 656-662.

*Primary Examiner* — Mamadou L Diallo
(74) *Attorney, Agent, or Firm* — McDermott Will & Emery LLP

(57) ABSTRACT

A semiconductor wafer includes chip regions; and a scribe region provided between the chip regions, the scribe region extending in a first direction in a plan view, wherein the scribe region includes a first region extending in the first direction, second regions situated on respective sides of the first region in a second direction perpendicular to the first direction in a plan view, each of the two second regions extending in the first direction, and an electrode pad provided in at least the second regions, and each of the two second regions includes one or more trench vias that are wall-shaped, the one or more trench vias extending in the first direction, and at least one trench via of the one or more trench vias having a portion overlapping with the electrode pad in a plan view.

12 Claims, 25 Drawing Sheets

(56) References Cited

U.S. PATENT DOCUMENTS

| | | | |
|---|---|---|---|
| 2009/0243044 A1* | 10/2009 | Tanaka | H01L 23/3171 |
| | | | 257/618 |
| 2011/0175232 A1 | 7/2011 | Ota et al. | |
| 2013/0069206 A1 | 3/2013 | Yoshizawa et al. | |
| 2014/0035139 A1 | 2/2014 | Kato | |
| 2015/0221554 A1* | 8/2015 | Kosaka | H01L 21/76898 |
| | | | 438/462 |
| 2016/0247849 A1* | 8/2016 | Oganesian | H01L 27/14625 |
| 2017/0345772 A1* | 11/2017 | Jackson | H01L 23/3192 |
| 2018/0261530 A1* | 9/2018 | Sekikawa | H01L 21/76224 |
| 2019/0198453 A1* | 6/2019 | Sekikawa | H01L 23/562 |
| 2021/0082809 A1* | 3/2021 | Kim | H01L 23/53295 |
| 2021/0143102 A1* | 5/2021 | Ko | H01L 23/5386 |

FOREIGN PATENT DOCUMENTS

| | | |
|---|---|---|
| JP | 2006-332533 A | 12/2006 |
| JP | 2008-258258 A | 10/2008 |
| JP | 2011-146563 A | 7/2011 |
| JP | 2013-042071 A | 2/2013 |
| JP | 2013-197516 A | 9/2013 |
| JP | 2014-033105 A | 2/2014 |
| JP | 2016-184745 A | 10/2016 |
| WO | 2007/074530 A1 | 7/2007 |

\* cited by examiner

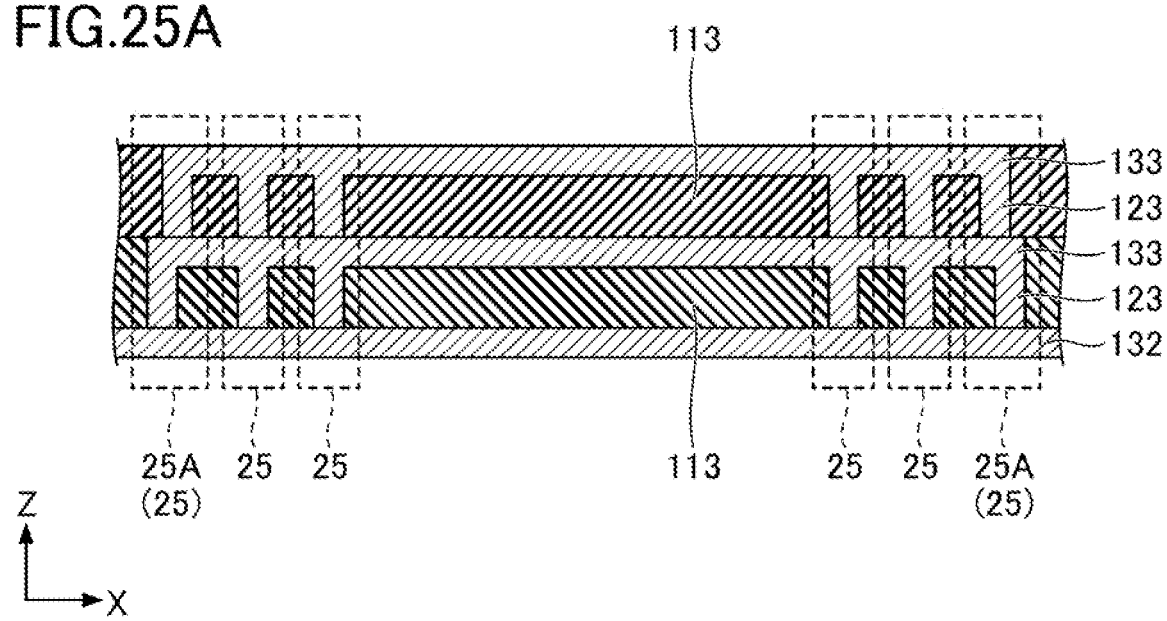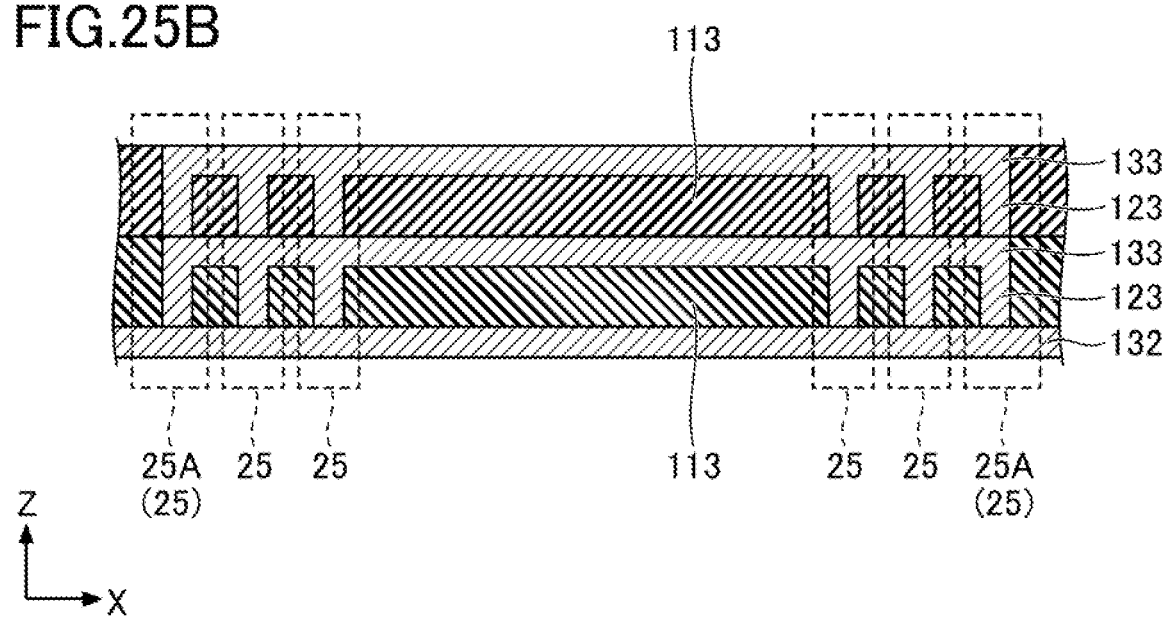

SEMICONDUCTOR WAFER AND SEMICONDUCTOR DEVICE FOR SUPPRESSING THE PROPAGATION OF CRACKS

CROSS-REFERENCE TO RELATED APPLICATIONS

The present application is based upon and claims the benefit of priority from the prior Japanese Patent Application No. 2019-215610 filed on Nov. 28, 2019, with the Japanese Patent Office, the entire contents of which are incorporated herein by reference.

BACKGROUND OF THE INVENTION

1. Field of the Invention

The disclosures herein relate to a semiconductor wafer and a semiconductor device.

2. Description of the Related Art

When a semiconductor device is to be manufactured, multiple chip regions are provided on a semiconductor wafer and a scribe region is provided between chip regions adjacent to each other. Then, a dicing blade is used to dice the semiconductor wafer in the scribe region. By doing so, the semiconductor wafer is separated into individual chips.

During the dicing of the semiconductor wafer, cracking in the scribe region sometimes occurs. There are cases where a cracking prevention structure is provided at an edge of a chip region in order to prevent such cracking from propagating into the chip region.

A conventional cracking prevention structure sometimes, however, cannot suppress propagation of cracking into the chip region.

There may be a need to provide a semiconductor wafer and a semiconductor device that are capable of suppressing propagation of cracking into a chip region.

RELATED-ART DOCUMENTS

Patent Documents

[Patent Document 1] Unexamined Japanese Patent Application Publication No. 2014-033105
[Patent Document 2] Unexamined Japanese Patent Application Publication No. 2013-197516
[Patent Document 3] Unexamined Japanese Patent Application Publication No. 2013-042071
[Patent Document 4] Unexamined Japanese Patent Application Publication No. 2011-146563
[Patent Document 5] International Publication No. WO 2007/074530
[Patent Document 6] Unexamined Japanese Patent Application Publication No. 2005-142553
[Patent Document 7] Unexamined Japanese Patent Application Publication No. 2008-258258
[Patent Document 8] Unexamined Japanese Patent Application Publication No. 2006-332533
[Patent Document 9] Unexamined Japanese Patent Application Publication No. 2003-086589
[Patent Document 10] Unexamined Japanese Patent Application Publication No. 2016-184745

Non-Patent Documents

[Non-Patent Document 1] Zhou-Jie Wu et al., 2018 IEEE 68th Electronic Components and Technology Conference, P656-662

SUMMARY OF THE INVENTION

According to an embodiment, a semiconductor wafer includes chip regions; and a scribe region provided between the chip regions, the scribe region extending in a first direction in a plan view, wherein the scribe region includes a first region extending in the first direction, second regions situated on respective sides of the first region in a second direction perpendicular to the first direction in a plan view, each of the two second regions extending in the first direction, and an electrode pad provided in at least the second regions, and each of the two second regions includes one or more trench vias that are wall-shaped, the one or more trench vias extending in the first direction, and at least one trench via of the one or more trench vias having a portion overlapping with the electrode pad in a plan view.

According to at least one embodiment, cracking is suppressed from propagating into the chip regions.

BRIEF DESCRIPTION OF THE DRAWINGS

Other objects and further features of the present disclosures will be apparent from the following detailed description when read in conjunction with the accompanying drawings, in which:

FIG. 25A and FIG. 25B are cross-sectional views illustrating the electrode pad in the variation of the Third Embodiment.

DESCRIPTION OF THE PREFERRED EMBODIMENTS

Figure 1:
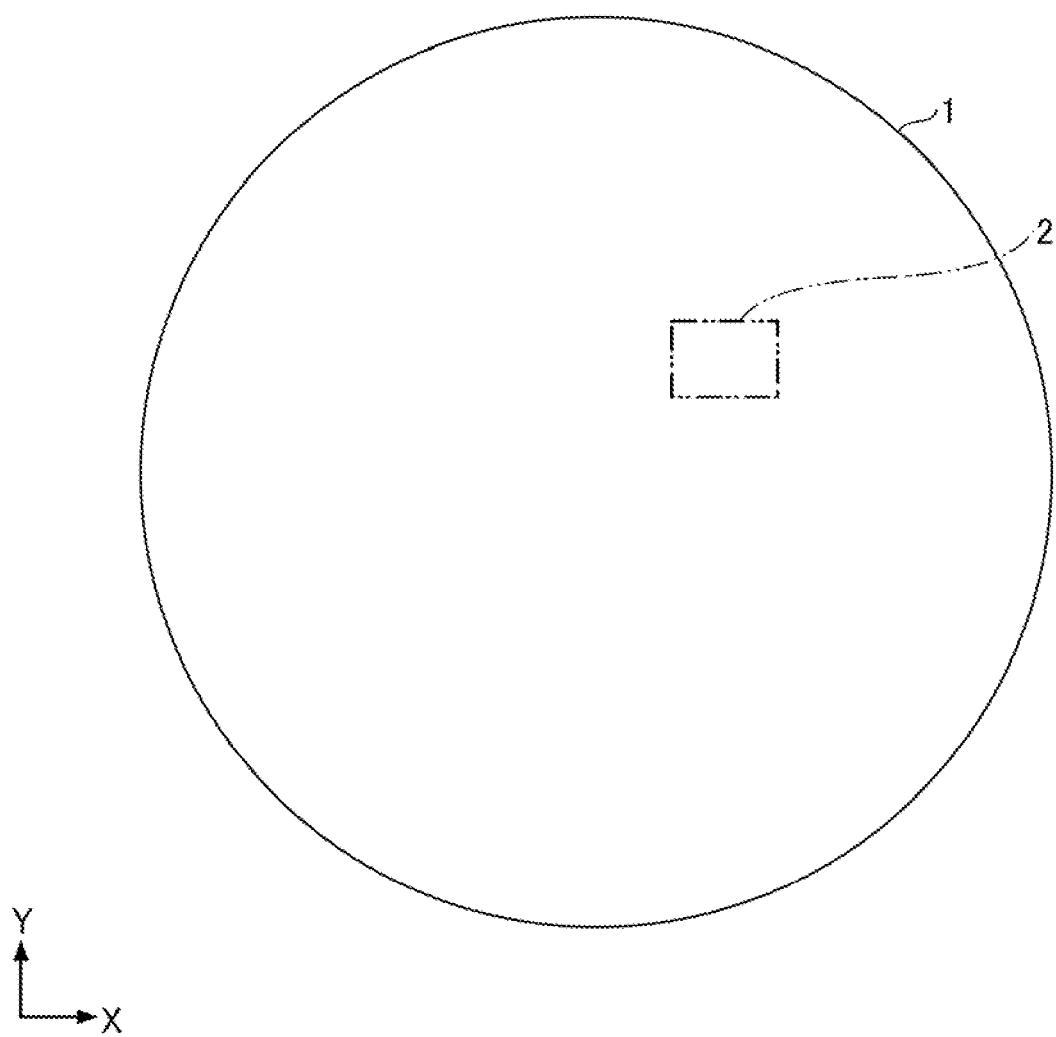
FIG. 1 is a diagram illustrating a semiconductor wafer according to a First Embodiment.

In the following, embodiments of the present disclosures will be described with reference to the accompanying drawings. In the specification and the drawings, overlapping descriptions of constituent elements having substantially the same functional configurations may be omitted when denoted by the same reference numeral. Also, in the descriptions below, the two directions that are both perpendicular to each other and parallel with surfaces of a substrate are referred to as the X-direction and the Y-direction, whereas the direction that is perpendicular to surfaces of the substrate is referred to as the Z-direction. Also, the plane extending in the X-direction and the Y-direction may be referred to as a plan view.

First Embodiment

Figure 2:
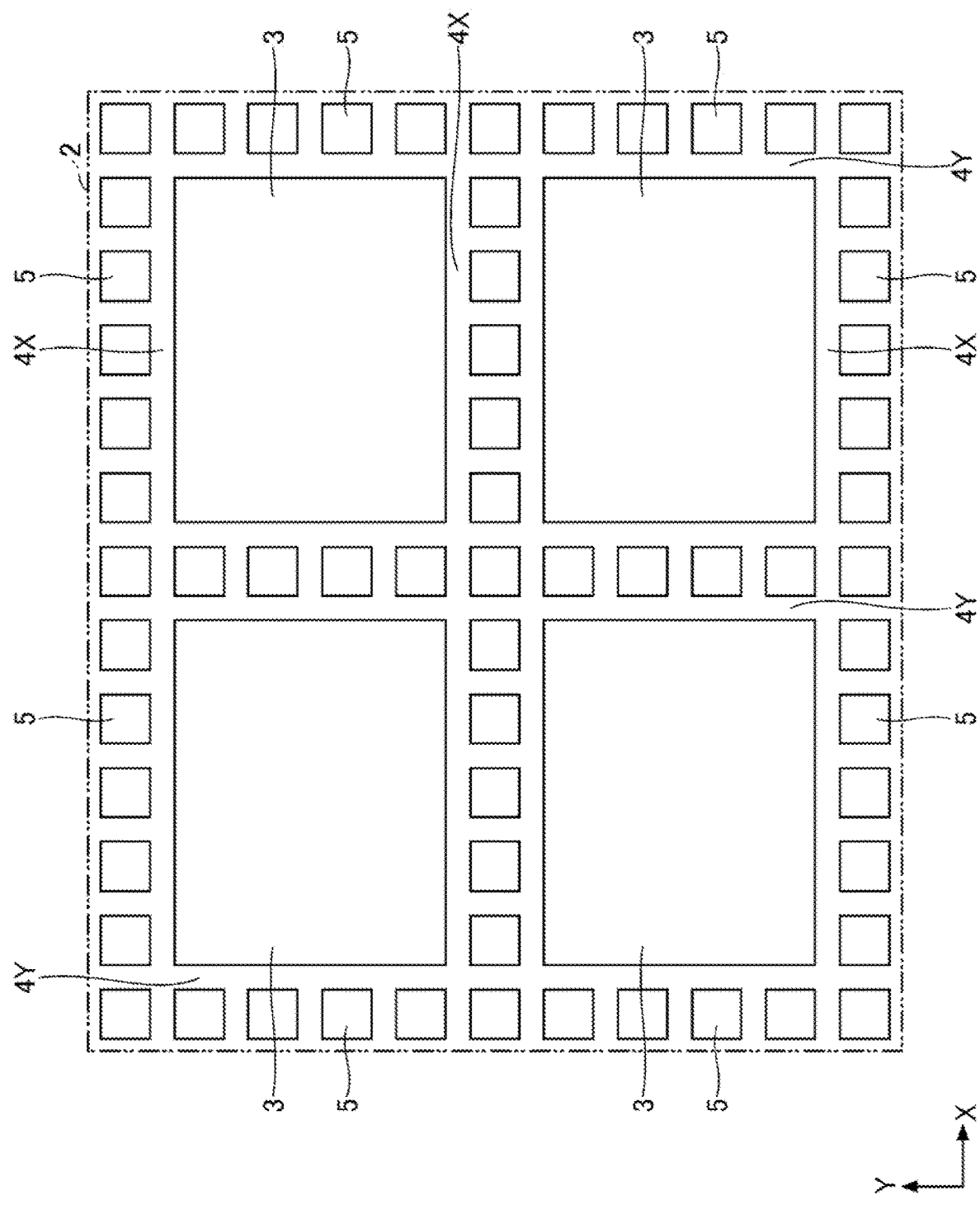
FIG. 2 is a diagram illustrating an enlarged view of a region that is a portion included in FIG. 1.

First, the First Embodiment is described. FIG. 1 is a diagram illustrating a semiconductor wafer according to the First Embodiment. FIG. 2 is a diagram illustrating an enlarged view of a region 2 that is a portion included in FIG. 1.

As illustrated in FIG. 1 and FIG. 2, a semiconductor wafer 1 includes multiple chip regions 3 aligned in the X-direction and the Y-direction. A scribe region 4Y extending in the Y-direction is provided between chip regions 3 that are adjacent to each other in the X-direction, and a scribe region 4X extending in the X-direction is provided between chip regions 3 that are adjacent to each other in the Y-direction. The scribe regions 4X and 4Y are provided with a monitor pattern (not illustrated) and electrode pads 5 coupled to the monitor pattern are provided on the surface in the scribe regions 4X and 4Y.

Figure 3:
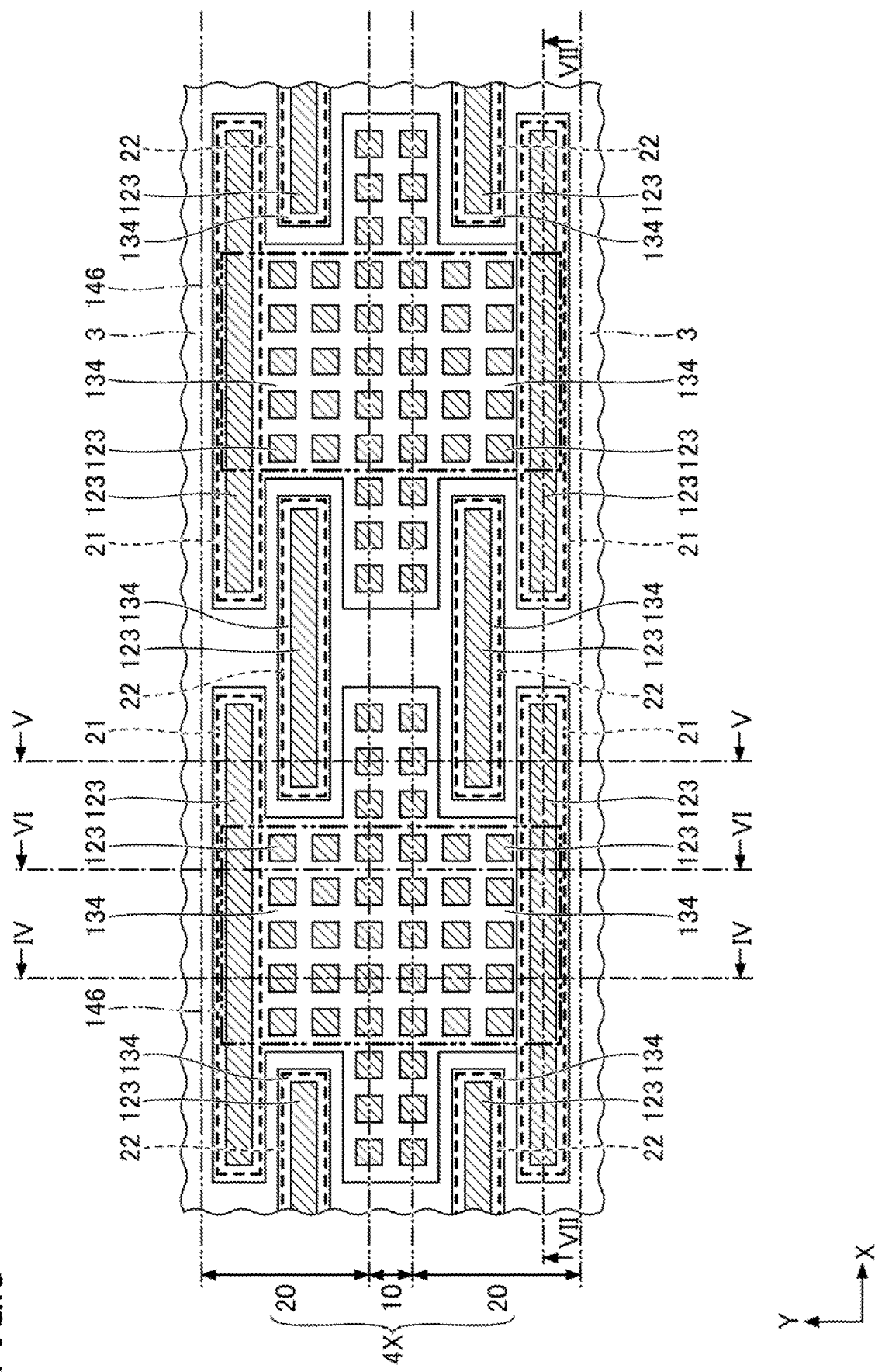
FIG. 3 is a schematic diagram illustrating a layout of a scribe region in the First Embodiment.
Figure 4:
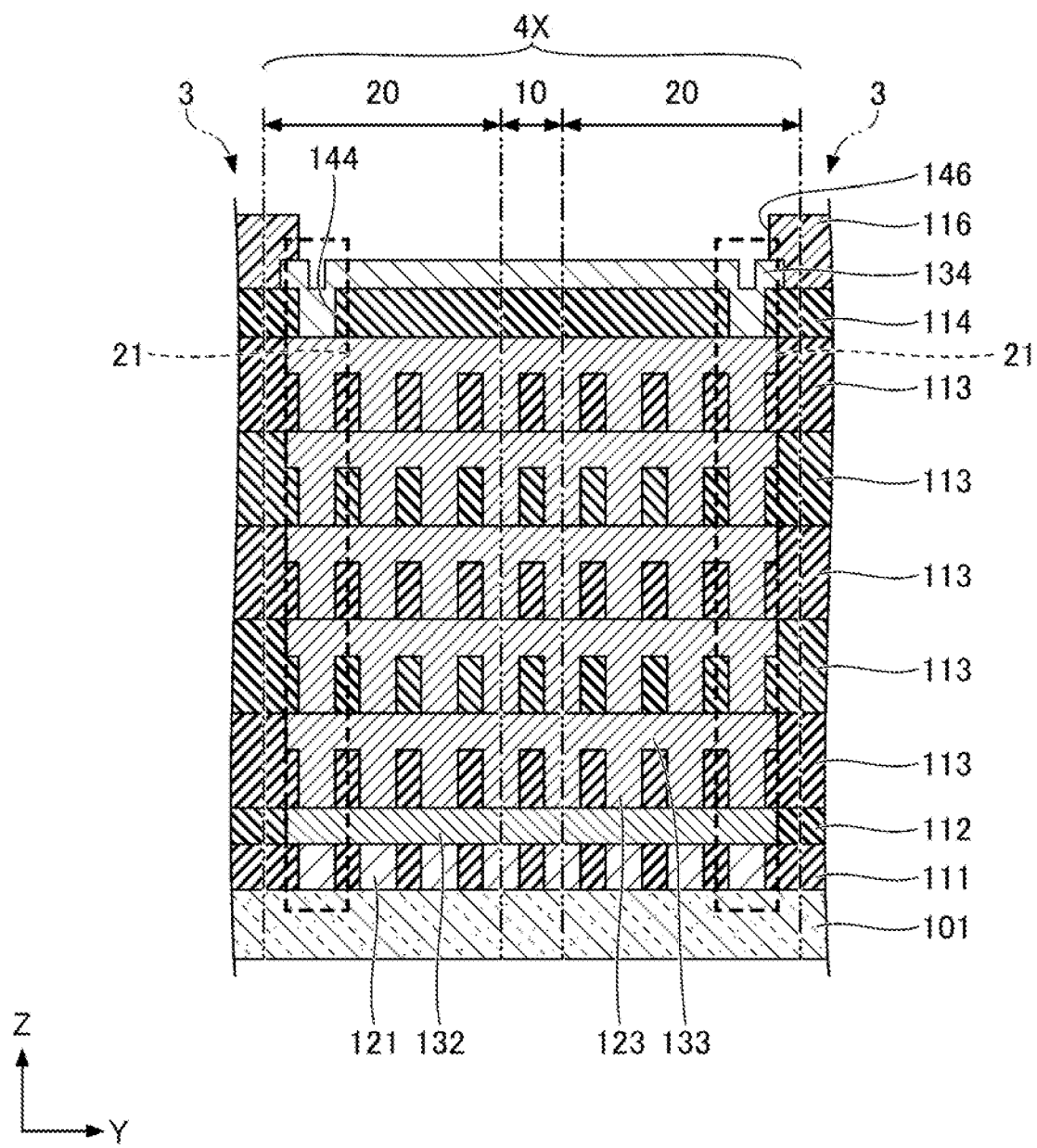
FIG. 4 is a cross-sectional view (first of four) illustrating the scribe region in the First Embodiment.
Figure 5:
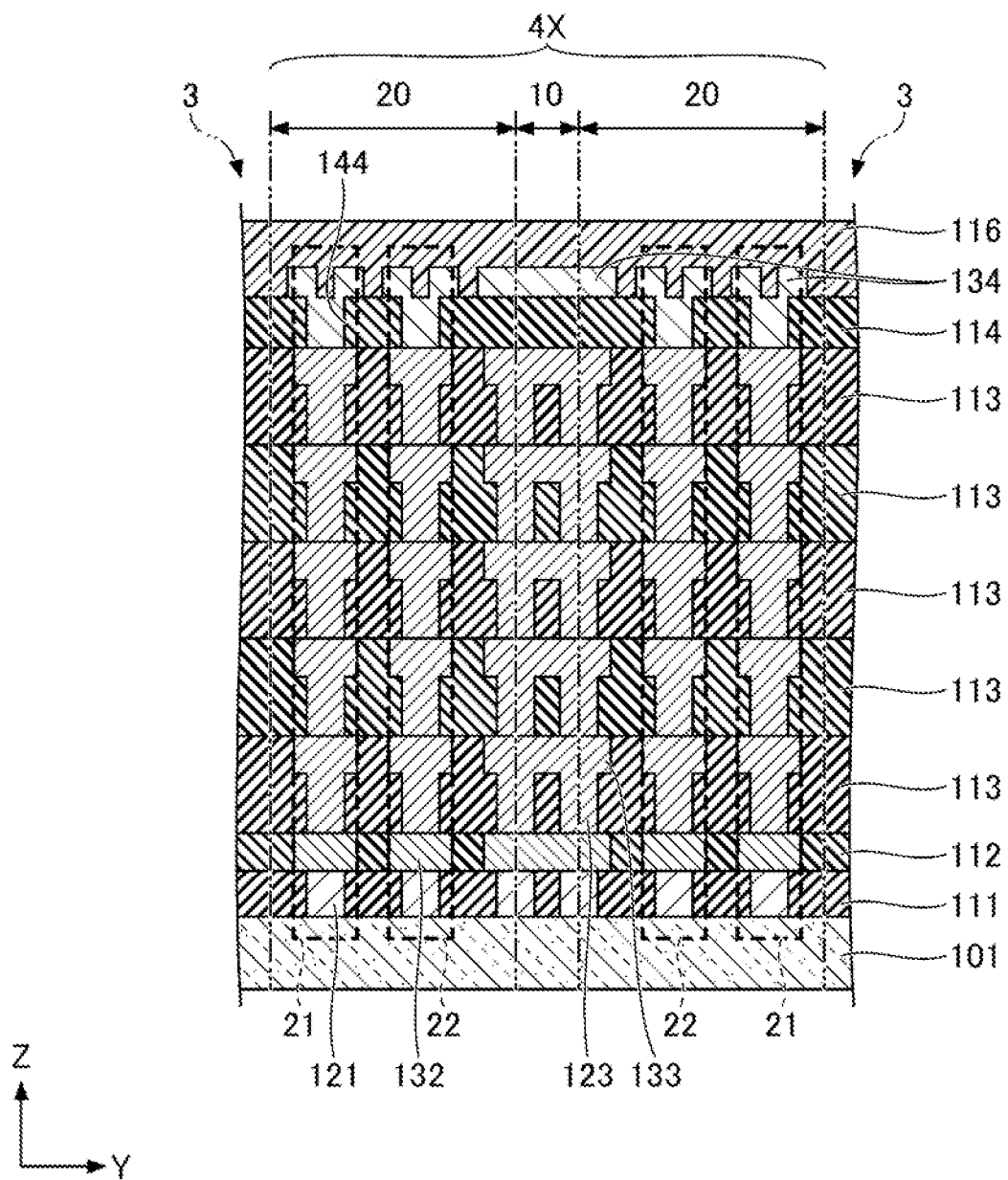
FIG. 5 is a cross-sectional view (second of four) illustrating the scribe region in the First Embodiment.
Figure 6:
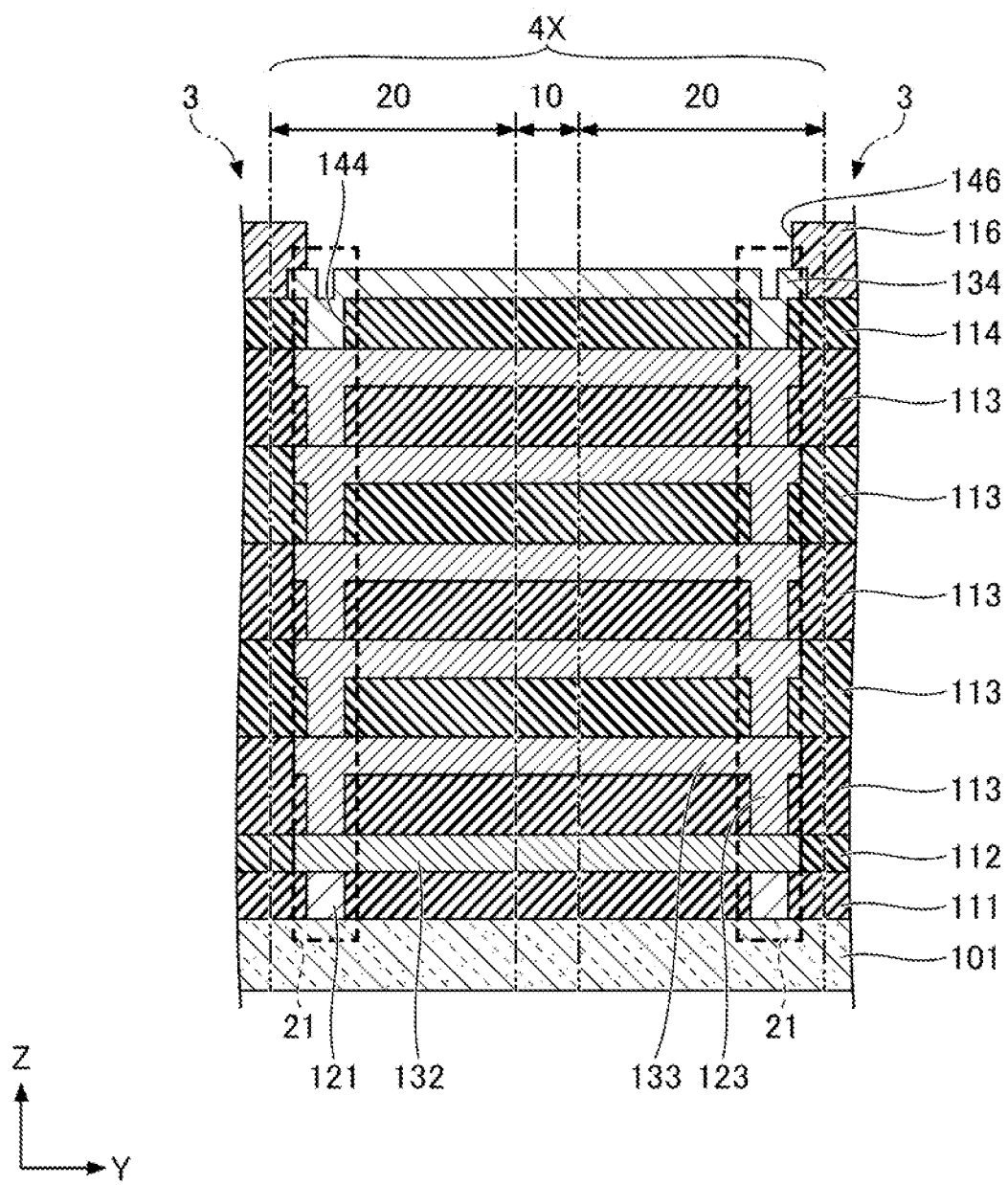
FIG. 6 is a cross-sectional view (third of four) illustrating the scribe region in the First Embodiment.

Here, the configuration of the scribe region 4X is described. FIG. 3 is a schematic diagram illustrating a layout of the scribe region 4X in the First Embodiment. FIG. 4 to FIG. 7 are cross-sectional views illustrating the scribe region 4X in the First Embodiment. FIG. 4 corresponds to a cross-sectional view taken along IV-IV line of FIG. 3. FIG. 5 corresponds to a cross-sectional view taken along V-V line of FIG. 3. FIG. 6 corresponds to a cross-sectional view taken along VI-VI line of FIG. 3. FIG. corresponds to a cross-sectional view taken along VII-VII line of FIG. 3.

First, the cross-sectional configuration of the scribe region 4X is described. As illustrated in FIG. 4 to FIG. 7, a first interlayer insulation film 111 is formed on a substrate 101 that is for example a silicon substrate. A via 121 is formed in the first interlayer insulation film 111. The first interlayer insulation film 111 is a film made of, for example, silicon oxycarbide (SiOC), silicon oxynitride (SiON), silicon oxide ($SiO_2$), or the like. The via 121 includes a film made of tungsten (W), ruthenium (Ru), cobalt (Co), or the like, and includes below the film an underlayer film made of titanium (Ti), titanium nitride (TiN), or the like, for example.

A second interlayer insulation film 112 is formed on the first interlayer insulation film 111. A wiring film 132 is formed within the second interlayer insulation film 112. The second interlayer insulation film 112 is a film made of, for example, silicon oxycarbide (SioC), silicon oxynitride (SiON, silicon oxide ($SiO_2$), or the like. The wiring film 132 includes a film made of copper (Cu), ruthenium (Ru), or the like, and includes below the film an underlayer film made of titanium (Ti), titanium nitride (TiN), tantalum (Ta), nitride tantalum (TaN), or the like, for example. In a case where the material of the wiring film 132 is ruthenium (Ru), the forming of the underlayer film may be omitted.

There are multiple third interlayer insulation films 113 formed on the second interlayer insulation film 112. A via 123 and a wiring film 133 are formed in each of the third interlayer insulation films 113. The wiring film 133 is formed on the via 123, and the wiring film 133 and the via 123 together form a dual damascene structure. The via 123 is coupled to the wiring film 132 or 133 immediately below the via 123. The third interlayer insulation film 113 is a film made of, for example, for example, silicon oxycarbide (SioC), silicon oxynitride (SiON, silicon oxide ($SiO_2$), or the like. The wiring film 133 and the via 123 include a film made of copper (Cu), ruthenium (Ru), or the like, and include below the film an underlayer film made of titanium (Ti), titanium nitride (TiN), tantalum (Ta), nitride tantalum (TaN), or the like, for example. In a case where the material of the wiring film 133 is ruthenium (Ru), the forming of the underlayer film may be omitted.

A fourth interlayer insulation film 114 is formed on the third interlayer insulation film 113 that is the topmost layer among the multiple third interlayer insulation films 113. A conductive film 134 is formed on the fourth interlayer insulation film 114. A via hole 144 is formed in the fourth interlayer insulation film 114 and the conductive film 134 is coupled to the wiring film 133 via the via hole 144. A cover film 116 is formed on the fourth interlayer insulation film 114 and the conductive film 134. The cover film 116 is formed with an opening 146 from which a portion of the conductive film 134 is exposed. The fourth interlayer insulation film 114 is made of silicon oxide ($SiO_2$), for example. The conductive film 134 is aluminum (Al), for example.

Next, the layout of the scribe region 4X is described. As illustrated in FIG. 3, the scribe region 4X includes a first region 10 that extends in the X-direction and second regions 20 that are situated on both sides of the first region 10 in the Y-direction and extend in a first direction. The width of the first region 10 is substantially equal to the width of the dicing blade.

Each of the second regions 20 has formed therein a first trench via 21 and a second trench via 22. The first trench via 21 and the second trench via 22 extend in the X-direction. The first trench via 21 is arranged farther away from the first region 10 than the second trench via 22.

Figure 7:
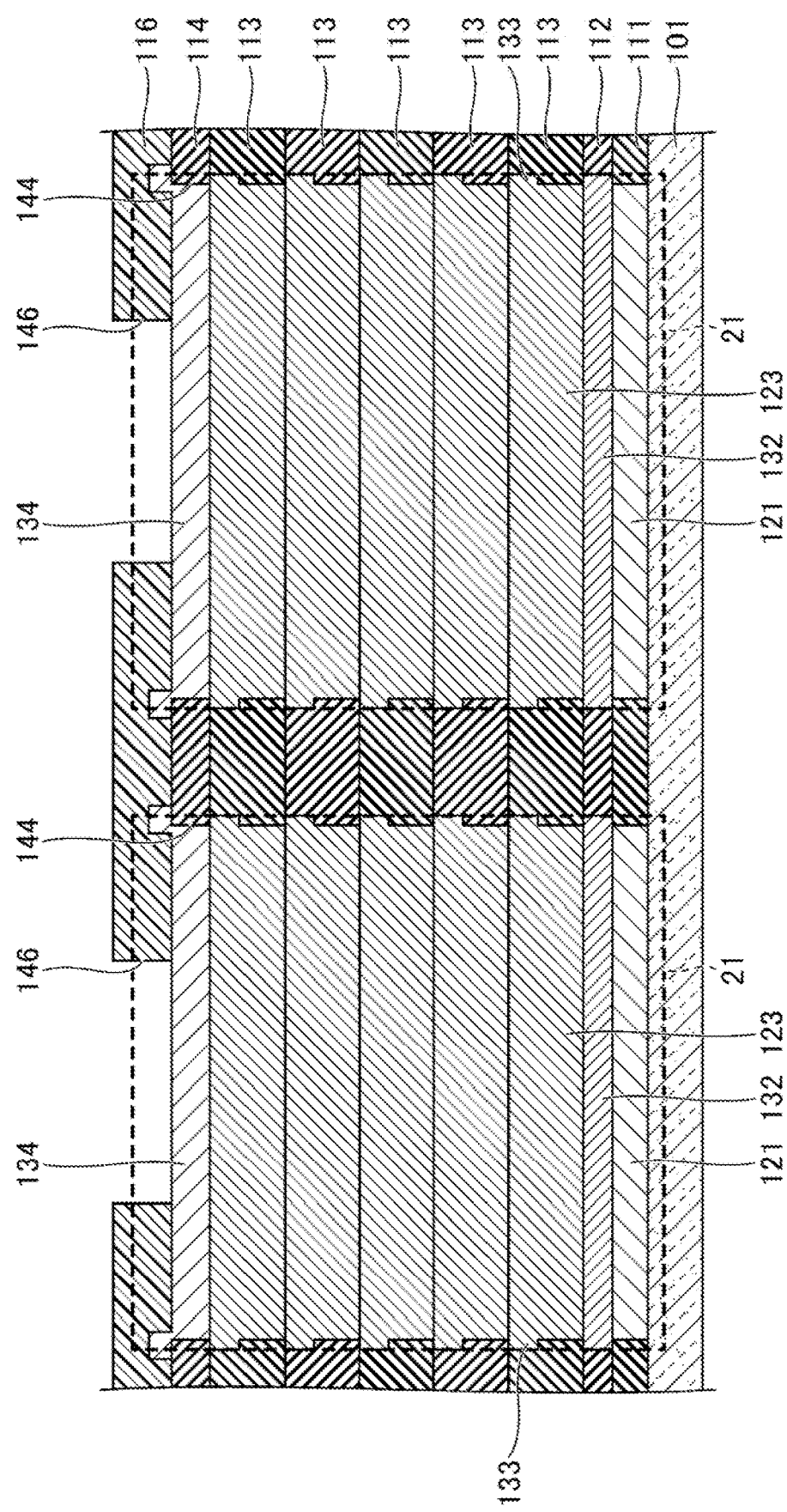
FIG. 7 is a cross-sectional view (fourth of four) illustrating the scribe region in the First Embodiment.

As illustrated in FIG. 7, the first trench via 21 has therein the via 121, the wiring film 132, the multiple vias 123, the multiple wiring films 133, and the conductive film 134 stacked upon one another. In other words, the stacked body of metal films, namely the via 121, the wiring film 132, the multiple vias 123, the multiple wiring films 133, and the conductive film 134, constitutes a wall.

The second trench via 22 also has therein the via 121, the wiring film 132, the multiple vias 123, the multiple wiring films 133, and the conductive film 134. In other words, the stacked body of metal films, namely the via 121, the wiring film 132, the multiple vias 123, the multiple wiring films 133, and the conductive film 134, constitutes a wall.

The opening 146 of the cover film 116 has a rectangular planar shape and has two sides parallel to the X-direction and two sides parallel to the Y-direction. The first trench via 21 has a portion that overlaps with the opening 146 in a plan view. In contrast to this, the second trench via 22 is arranged away from the opening 146 in the X-direction.

In each of the second regions 20, the second trench via 22 is arranged such that the negative X-direction side-situated end portion of the second trench via 22 overlaps with a single first trench via 21 and such that the positive X-direction side-situated other end portion of the second trench via 22 overlaps with another first trench via 21, as viewed in the Y-direction. Further, the first trench via 21 is arranged such that the negative X-direction side-situated end portion of the trench via 21 overlaps with a single second trench via 22 and such that the positive X-direction side-situated other end portion of the first trench via 21 overlaps with another second trench via 22, as viewed in the Y-direction. Therefore, a trench-via wall composed of multiple trench vias is provided continuously along the entirety of the scribe region 4X as viewed in the Y-direction. Alternatively, the trench-via wall may be provided along only a portion of the scribe region 4X.

Although not illustrated in FIG. 3 to FIG. 7, a monitor pattern is provided in the scribe region 4X and the conductive film 134 is coupled to the monitor pattern. Also, the portion of the conductive film 134 exposed from the opening 146 is used as the electrode pad 5 when performing a characteristics test using the monitor pattern.

The scribe region 4Y has the same configuration as the scribe region 4X, except for the fact that the orientations of each of the constituent elements in the first region 10, the second regions 20, and the like, are different. Therefore, in each of the second regions 20 of the scribe region 4Y, the second trench via 22 is arranged such that the negative Y-direction side-situated end portion of the second trench via 22 overlaps with a single first trench via 21 and such that the positive Y-direction side-situated end portion overlaps with another first trench via 21, as viewed in the X-direction. Conversely, the first trench via 21 is arranged such that the negative Y-direction side-situated end portion of the first trench via 21 overlaps with a single second trench via 22 and such that the positive Y-direction side-situated end portion overlaps with another second trench via 22, as viewed in the X-direction. Therefore, a trench-via wall composed of multiple trench vias is provided continuously along the entirety of the scribe region 4Y as viewed from in the X-direction. Alternatively, the trench-via wall may be provided along only a portion of the scribe region 4Y.

For example, the trench vias 21 and 22 in the scribe region 4X are arranged in the Y-direction within both Y-direction edges of the electrode pad 5. Similarly, the trench vias 21 and 22 in the scribe region 4Y are arranged in the X-direction within both X-direction edges of the electrode pad 5.

Figure 8:
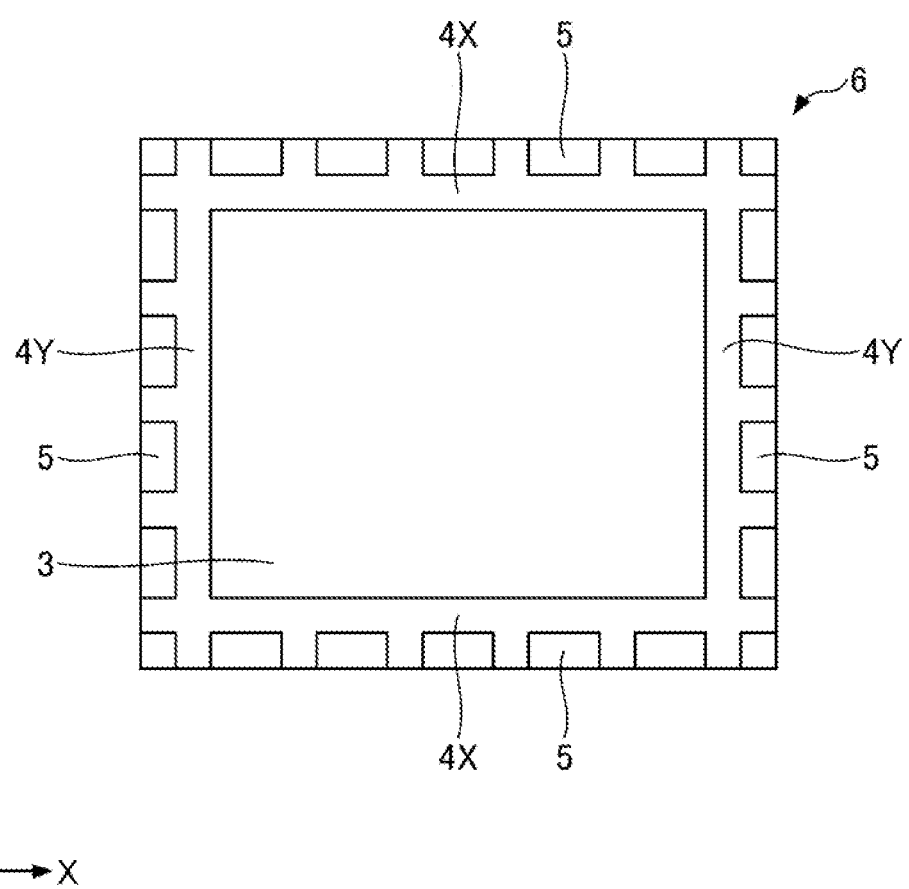
FIG. 8 is a diagram illustrating a semiconductor device after separation in the First Embodiment.
Figure 9:
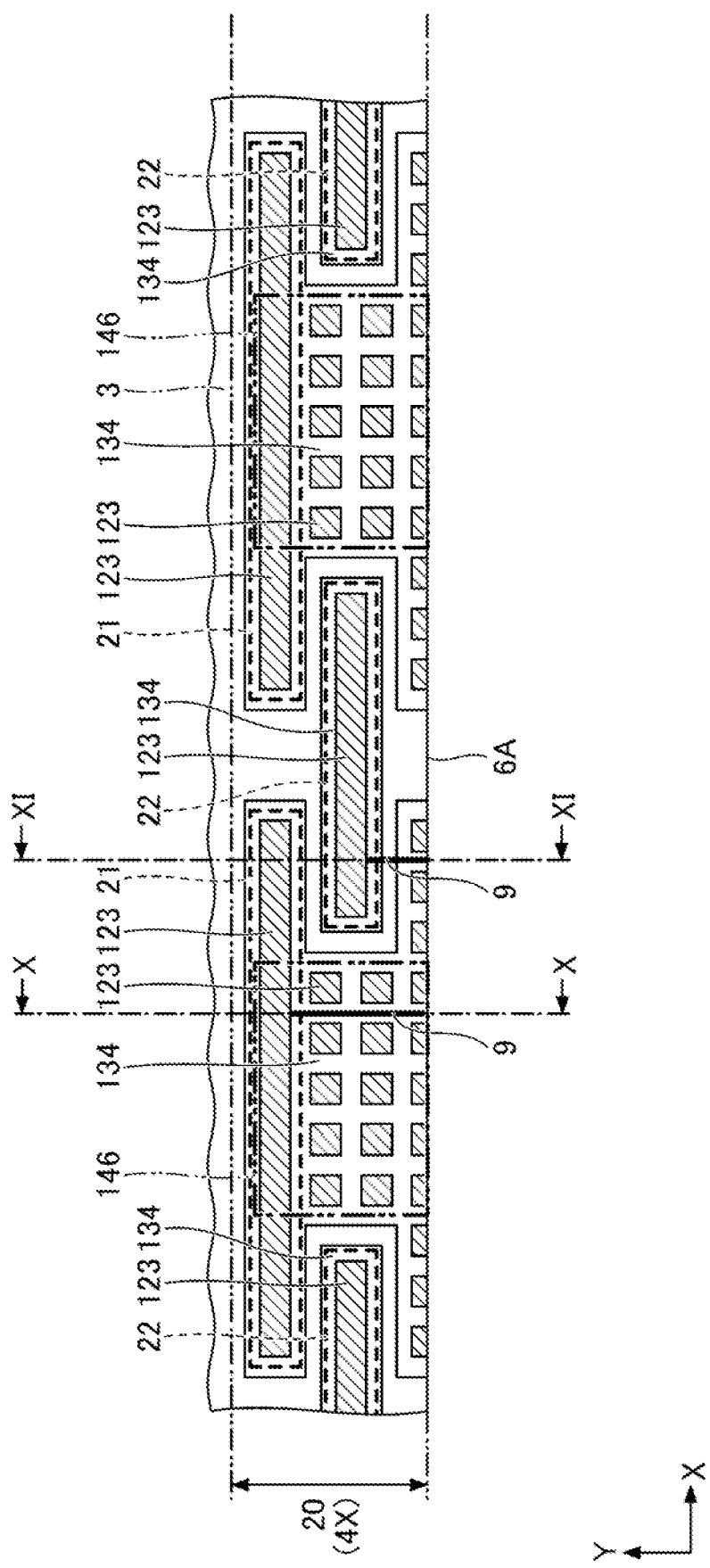
FIG. 9 is a diagram illustrating a layout of a scribe region after separation in the First Embodiment.
Figure 10:
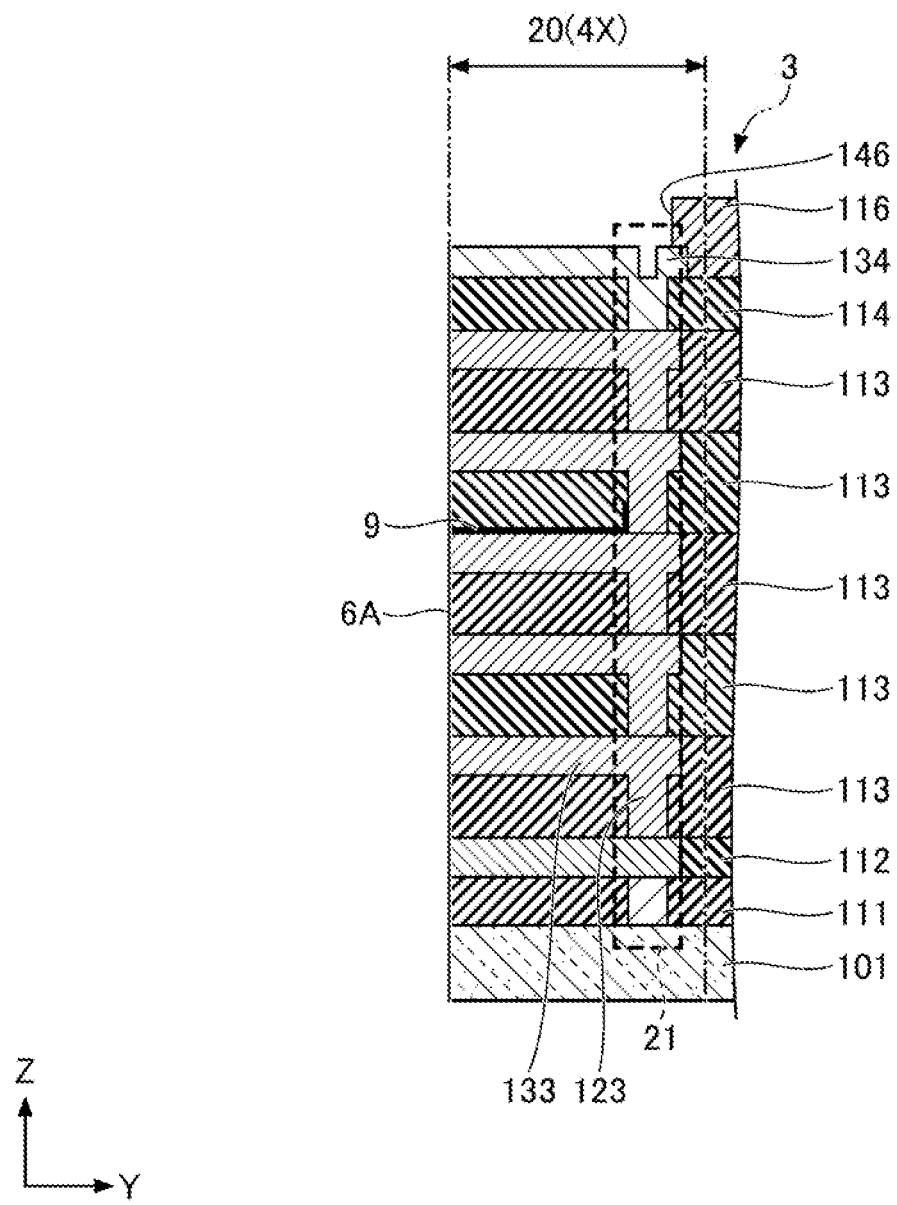
FIG. 10 is a cross-sectional view (first of two) illustrating the scribe region after separation in the First Embodiment.
Figure 11:
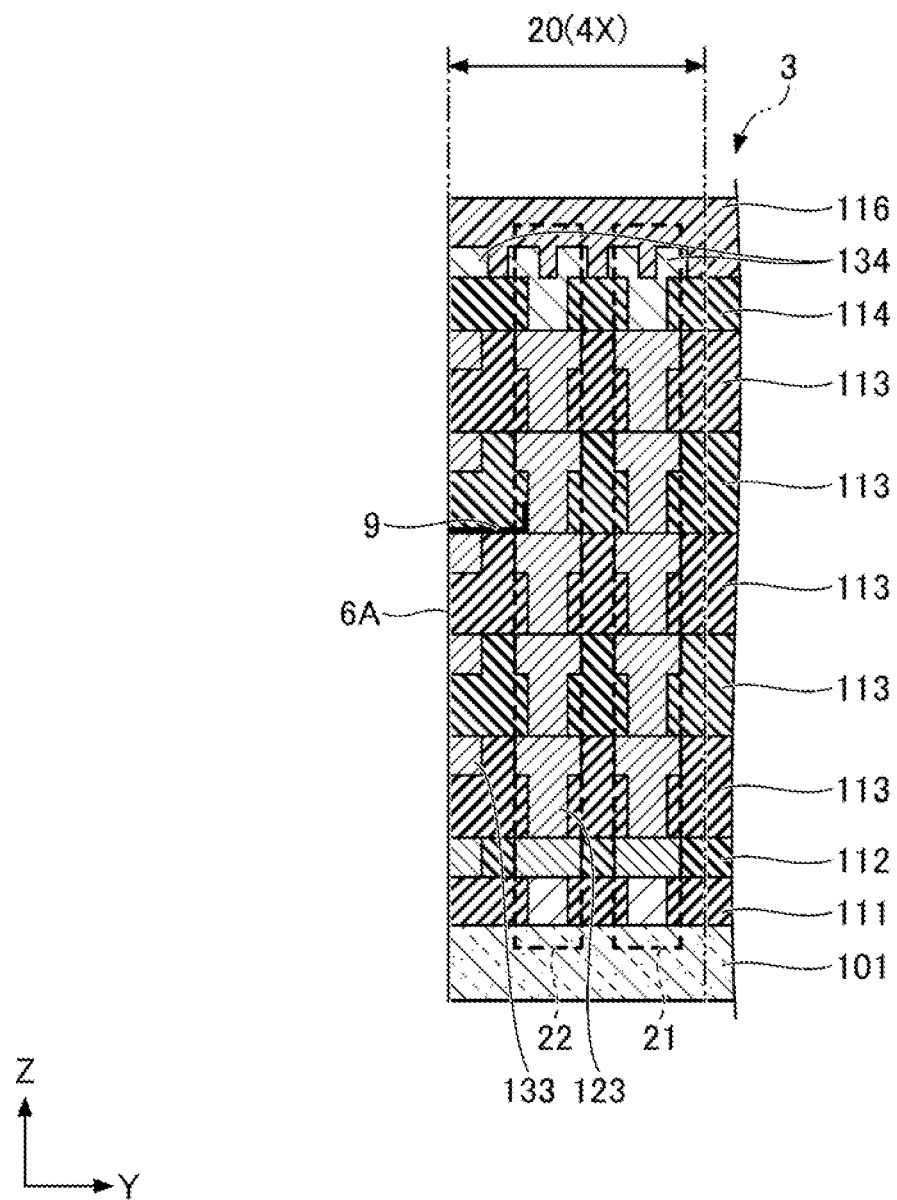
FIG. 11 is a cross-sectional view (second of two) illustrating the scribe region after separation in the First Embodiment.

After the characteristics test is performed, the semiconductor wafer 1 is diced by a dicing blade along the scribe regions 4X and 4Y. By doing so, the semiconductor wafer 1 is separated into individual semiconductor devices. FIG. 8 is a diagram illustrating a semiconductor device after separation in the First Embodiment. FIG. 9 is a diagram illustrating a layout of the scribe region 4X after separation in the First Embodiment. FIG. 10 and FIG. 11 are cross-sectional views illustrating the scribe region 4X after separation in the First Embodiment. FIG. 10 corresponds to a cross-sectional view taken along X-X line of FIG. 9. FIG. 11 corresponds to a cross- sectional view taken along XI-XI line of FIG. 9.

When the semiconductor wafer 1 is to be diced, a dicing blade that is approximately the same thickness as the width of the first region 10 is used. The first region 10 is diced by the dicing blade. As a result of this, the first region 10 is diced, and multiple semiconductor devices 6 are obtained.

As illustrated in FIG. 8, the semiconductor device 6 includes a chip region 3, a remaining portion of the scribe region 4X, and a remaining portion of the scribe region 4Y. As illustrated in FIG. 9 to FIG. 11, the remaining portions of the scribe regions 4X and 4Y substantially match a corresponding one of the second regions 20. In other words, a trench-via wall composed of multiple trench vias is provided continuously along the entirety of the remaining portion of the scribe region 4X as viewed in the Y-direction. Likewise, a trench wall composed of multiple trench vias is provided continuously along the entirety of the remaining portion of the scribe region 4Y as viewed in the X-direction. Alternatively, the trench-via wall may be provided along only a portion of the remaining portion of the scribe region 4X or along only a portion of the remaining portion of the scribe region 4Y.

During the dicing of the semiconductor wafer 1, cracking 9 in the scribe region 4X sometimes occurs. The cracking 9, as illustrated in FIG. 9 to FIG. 11, originating at a dicing plane (side surface) 6A of the semiconductor device 6 is prone to propagate along the interface between two of the insulation films or along the interface between the insulation film and the metal film. In the First Embodiment, either the trench via 21 or the trench via 22 exist between the dicing plane 6A and the chip region 3. In the trench via 21 and the trench via 22, the stacked body metal films, namely the via 121, the wiring film 132, the multiple vias 123, the multiple wiring films 133, and the conductive film 134, constitute a wall (refer to FIG. 7). Therefore, even when the cracking 9 propagates toward the chip region 3, the propagation of the cracking 9 is obstructed by at least one of the trench via 21 or the trench via 22 as illustrated in FIG. 9.

As described according to the First Embodiment, the cracking 9 is suppressed from propagating into the chip region 3.

Also, in the First Embodiment, since the trench via 21 and the trench via 22 in the scribe region 4X are arranged in the Y-direction within both Y-direction edges of an electrode pad 5, the trench via 21 and the trench via 22 in the scribe region 4X are unlikely to hinder placement of any additional electrode pads 5. Likewise, since the trench via 21 and the trench via 22 in the scribe region 4Y are arranged in the X-direction within both X-direction edges of the electrode pad 5, the trench via 21 and the trench via 22 inside the scribe region 4Y are unlikely to hinder placement of any additional electrode pads 5.

The width of the first region 10 need not have the same thickness as the dicing blade. It is not necessary to dice the entirety of the first region 10. That is, a portion of the first region 10 may remain after dicing. Likewise, it is not necessary to dice the entirety of the second region 20. That is, a portion of the second region 20 may remain after dicing.

The via 123 may have a single damascene structure. In such a case, the via 123 may include a film made of tungsten (W), ruthenium (Ru), cobalt (Co), or the like, and may include below the film an underlayer film made of titanium (Ti), titanium nitride (TiN), or the like, for example.

First Variation of First Embodiment

Figure 12:
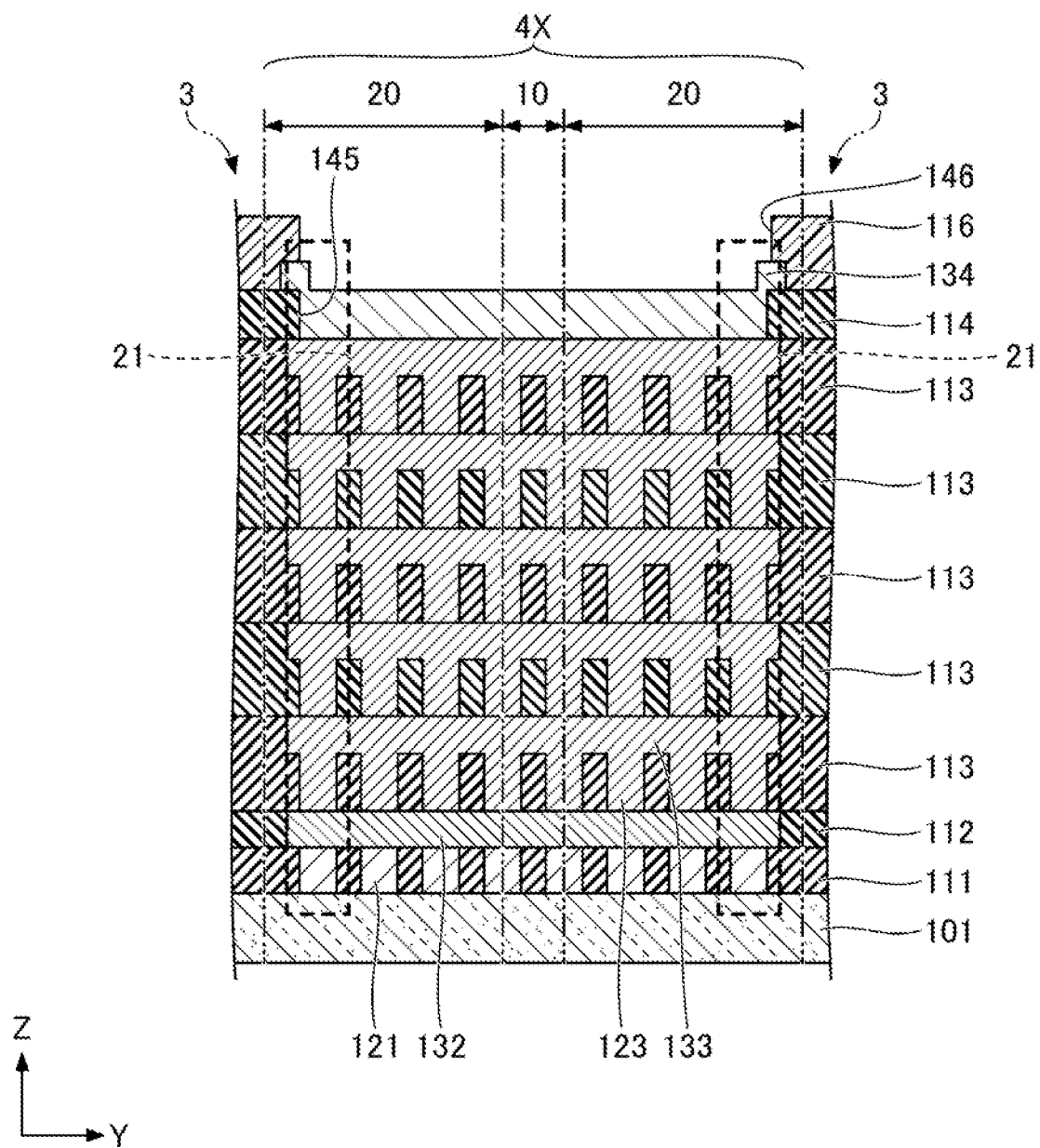
FIG. 12 is a cross-sectional view (first of two) illustrating a scribe region in a First Variation of the First Embodiment.
Figure 13:
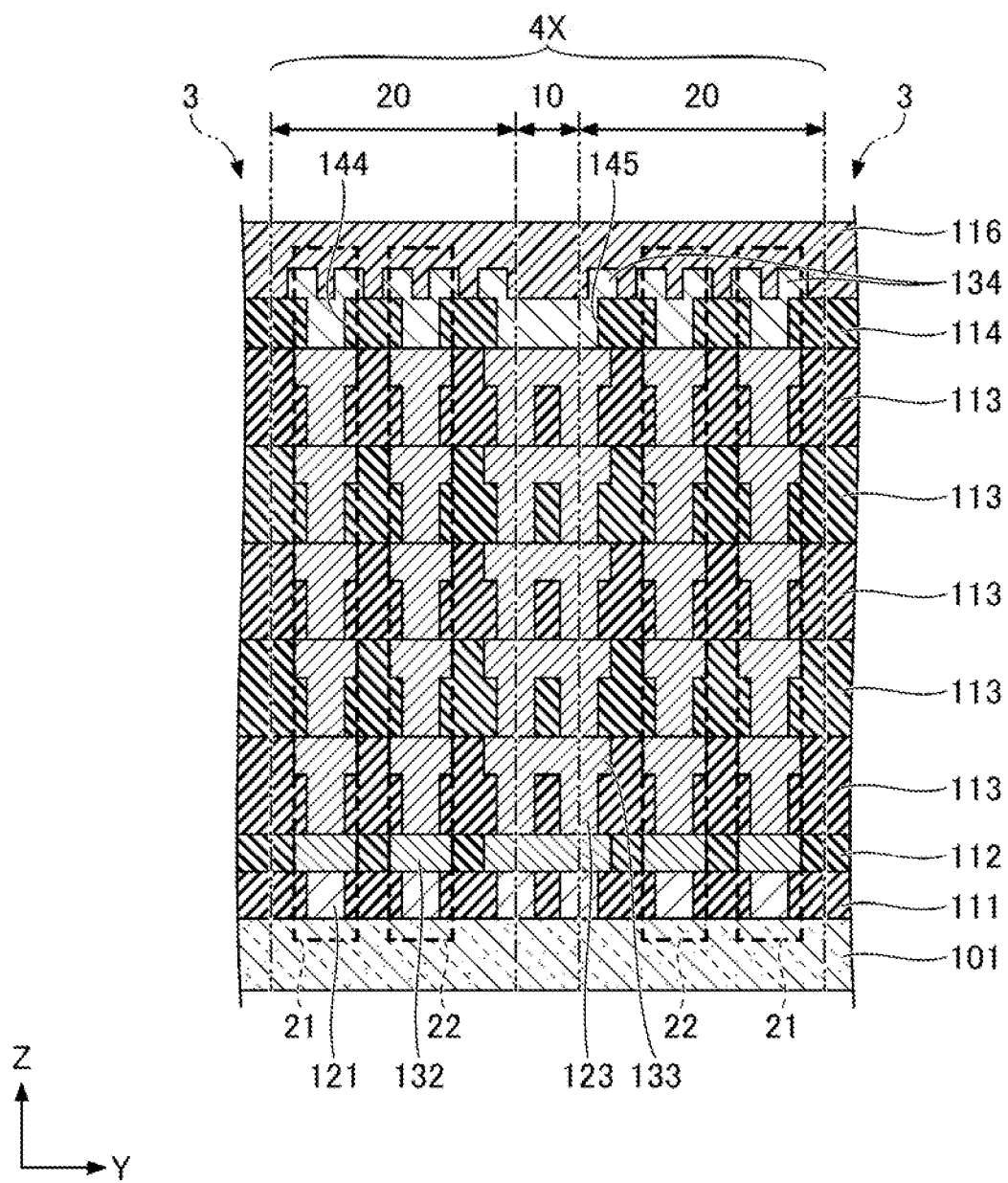
FIG. 13 is a cross-sectional view (second of two) illustrating the scribe region in the First Variation of the First Embodiment.

Next, the First Variation of the First Embodiment is described. The First Variation differs from the First Embodiment mainly in terms of the configuration of the conductive film 134. FIG. 12 and FIG. 13 are cross-sectional views illustrating a scribe region 4X in the First Variation of the First Embodiment. FIG. 12 corresponds to a cross-sectional view taken along IV-IV line of FIG. 3. FIG. 13 corresponds to a cross-sectional view taken along V-V line of FIG. 3.

In the First Variation, the fourth interlayer insulation film 114 portion overlapping with the electrode pad 5 in a plan view has formed therein an opening 145, as illustrated in FIG. 12 and FIG. 13. The opening 145 is formed so as to encompass a via hole 144 within the first trench via 21 in the First Embodiment. Also, the opening 145 extends between the second trench vias 22 adjacent to each other in the Y-direction.

In the First Variation as well, the scribe region 4Y has the same configuration as the scribe region 4X, except for the fact that the orientations of each of the constituent elements in the first region 10, the second regions 20, and the like are different.

The other aspects of the configuration are the same as those in the First Embodiment.

The First Variation of the First Embodiment can provide substantially the same effects as those in the First Embodiment.

Second Variation of First Embodiment

Figure 14:
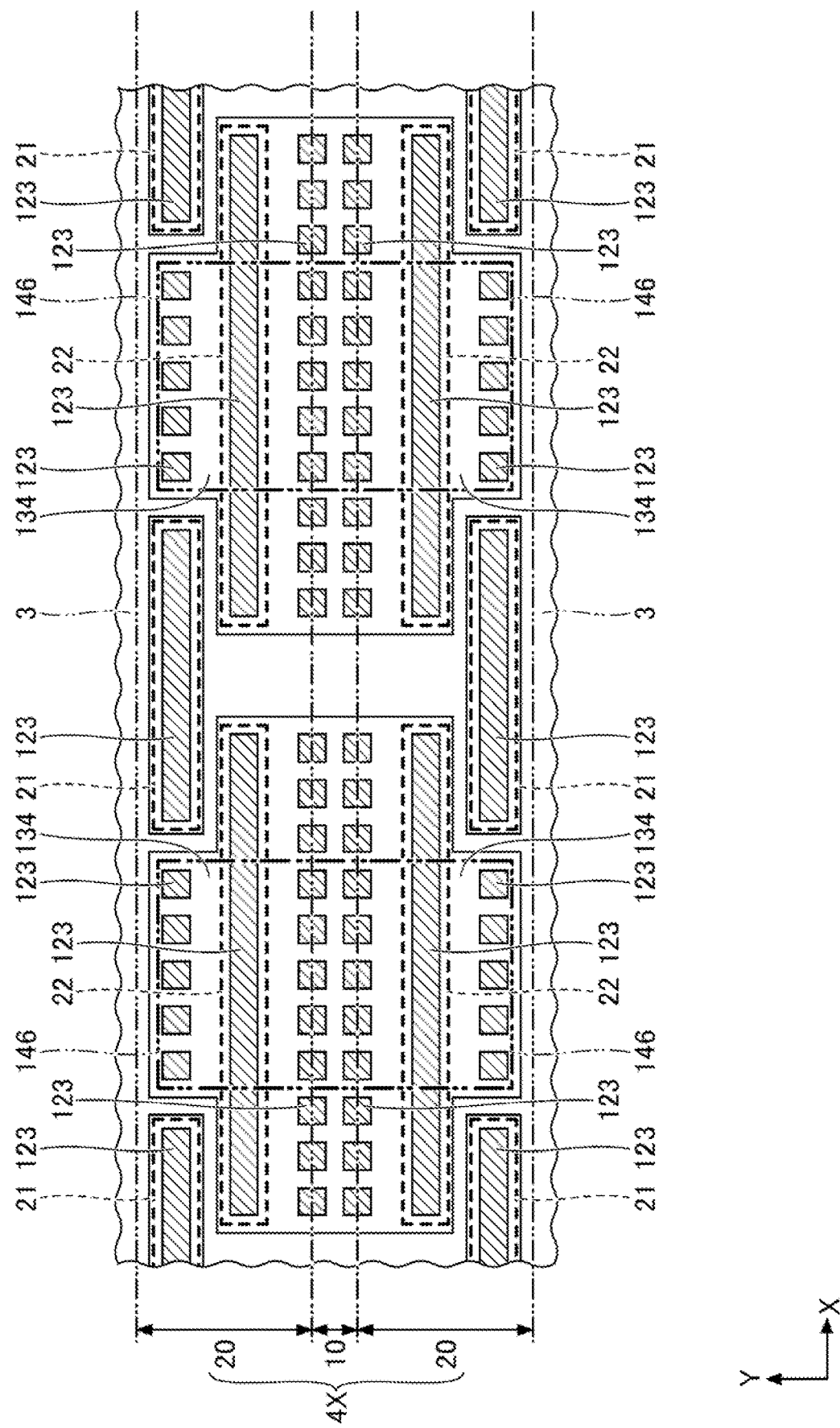
FIG. 14 is a schematic diagram illustrating a layout of a scribe region in a Second Variation of the First Embodiment.

Next, the Second Variation of the First Embodiment is described. The Second Variation differs from the First Embodiment mainly in terms of the arrangement of the trench vias. FIG. 14 is a schematic diagram illustrating a layout of the scribe region 4X in the Second Variation of the First Embodiment.

In the Second Variation, the first trench via 21 arranged farther away from the first region 10 than the second trench via 22 is arranged away from the opening 146 in the X-direction, as illustrated in FIG. 14. In contrast to this, the second trench via 22 has a portion that overlaps with the opening 146 in a plan view.

In the Second Variation, the scribe region 4Y has the same configuration as the scribe region 4X, except for the fact that the orientations of each of the constituent elements in the first region 10, the second regions 20, and the like are different.

Other aspects of the configuration are the same as those in the First Embodiment.

Figure 15:
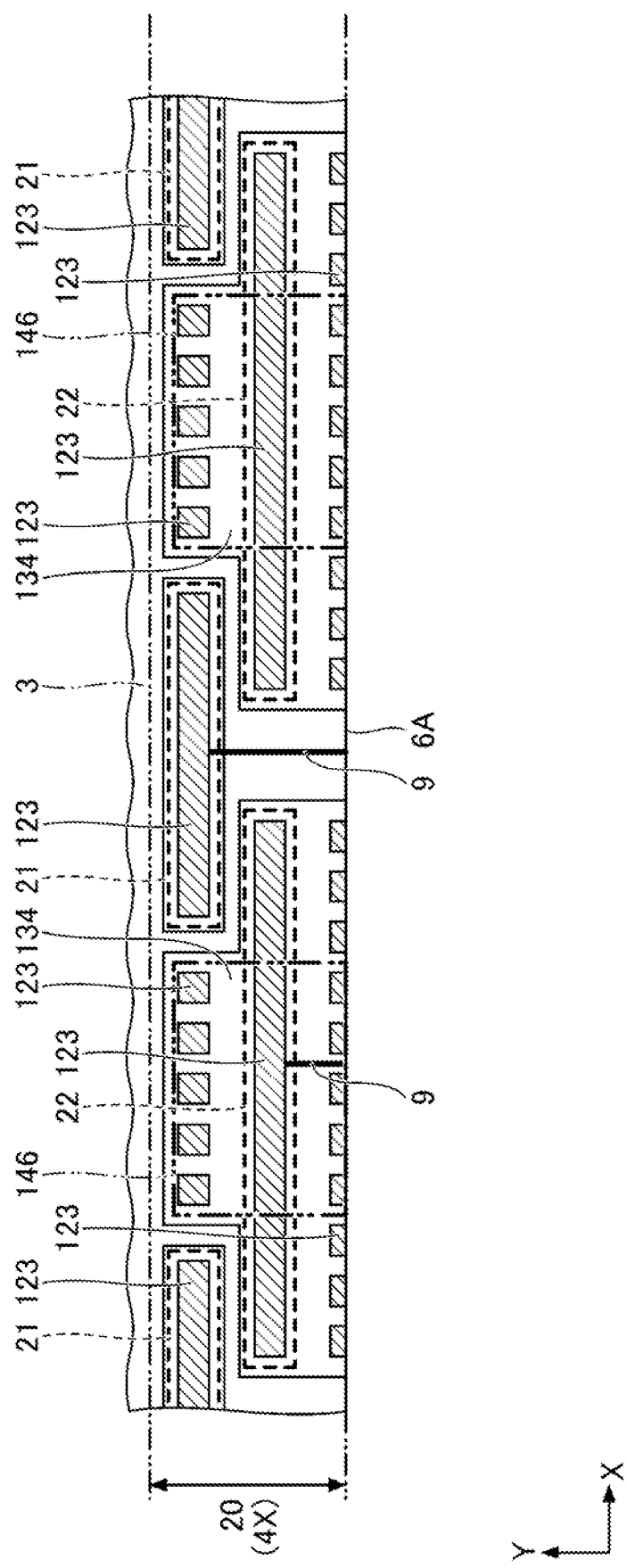
FIG. 15 is a diagram illustrating a layout of the scribe region after separation the Second Variation of the First Embodiment.

FIG. 15 is a diagram illustrating a layout of the scribe region 4X after separation in the Second Variation of the First Embodiment. Similar to the First Embodiment, the remaining portions of the scribe regions 4X and 4Y substantially match a corresponding one of the second regions 20, as illustrated in FIG. 15. In other words, a trench-via wall composed of multiple trench vias is provided continuously along the entirety of the remaining portion of the scribe region 4X as viewed in in the Y-direction. Likewise, a trench-via wall composed of multiple trench regions is provided continuously along the entirety of the remaining portion of the scribe region 4Y as viewed in the X-direction. Alternatively, the trench-via wall may be provided along only a portion of the remaining portion of the scribe region 4X or along only a portion of the remaining portion of the scribe region 4Y.

The Second Variation of the First Embodiment can provide substantially the same effects as those in the First Embodiment.

Third Variation of First Embodiment

Figure 16:
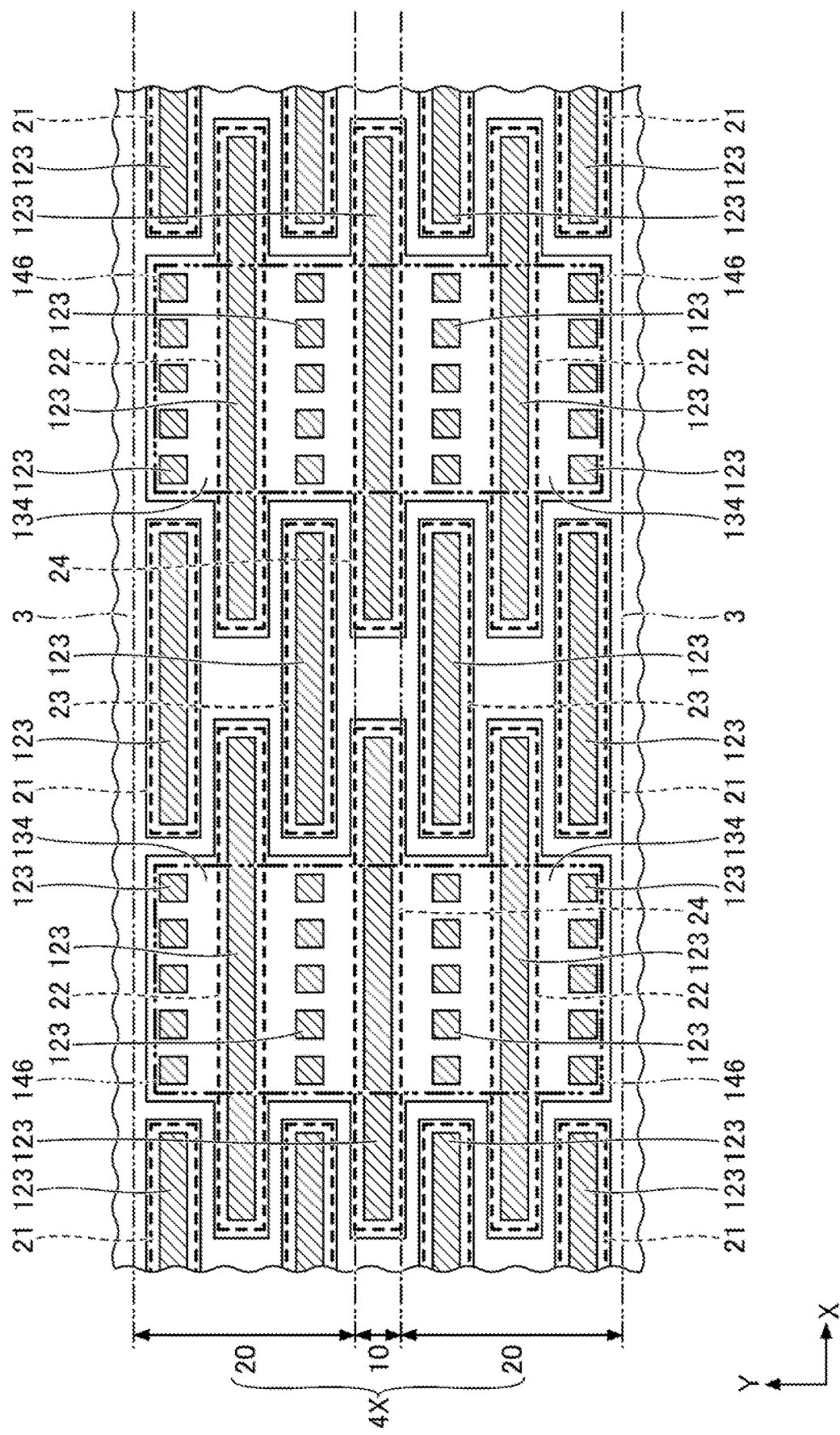
FIG. 16 is a schematic diagram illustrating a layout of a scribe region in a Third Variation of the First Embodiment.

Next, the Third Variation of the First Embodiment is described. The Third Variation differs from the First Embodiment mainly in terms of the arrangement of the trench vias. FIG. 16 is a schematic diagram illustrating a layout of the scribe region 4X in the Third Variation of the First Embodiment.

In the Third Variation, similar to the Second Variation, the first trench via 21 arranged farther away from the first region 10 than the second trench via 22 is arranged away from the opening 146 in the X-direction, as illustrated in FIG. 16. In contrast to this, the second trench via 22 has a portion that overlaps with the opening 146 in a plan view.

In the Third Variation, each second region 20 is further provided with a third trench via 23. The third trench via 23 extends in the X-direction. The third trench via 23 is arranged closer to the first region 10 than the second trench via 22. The third trench via 23 is arranged substantially in the same position as the first trench via 21 in the X-direction. The third trench via 23 includes a cross-sectional configuration substantially the same as that of the first trench via 21.

In the Third Variation, a fourth trench via is disposed between the third trench vias 23 adjacent to each other in the Y-direction within the scribe region 4X. The fourth trench via 24 extends in the X-direction. The fourth trench via 24 may be arranged within the first region 10. The fourth trench via 24 is arranged in substantially the same position as the second trench via 22 in the X-direction. The fourth trench via 24 includes a cross-sectional configuration substantially the same as that of the first trench via 21.

In the Third Variation as well, the scribe region 4Y has a configuration that is the same as the scribe region 4X, except for the fact that the orientations of each of the constituent elements in the first region 10, the second regions 20, and the like are different.

The other aspects of the configuration are the same as those in the First Embodiment.

Figure 17:
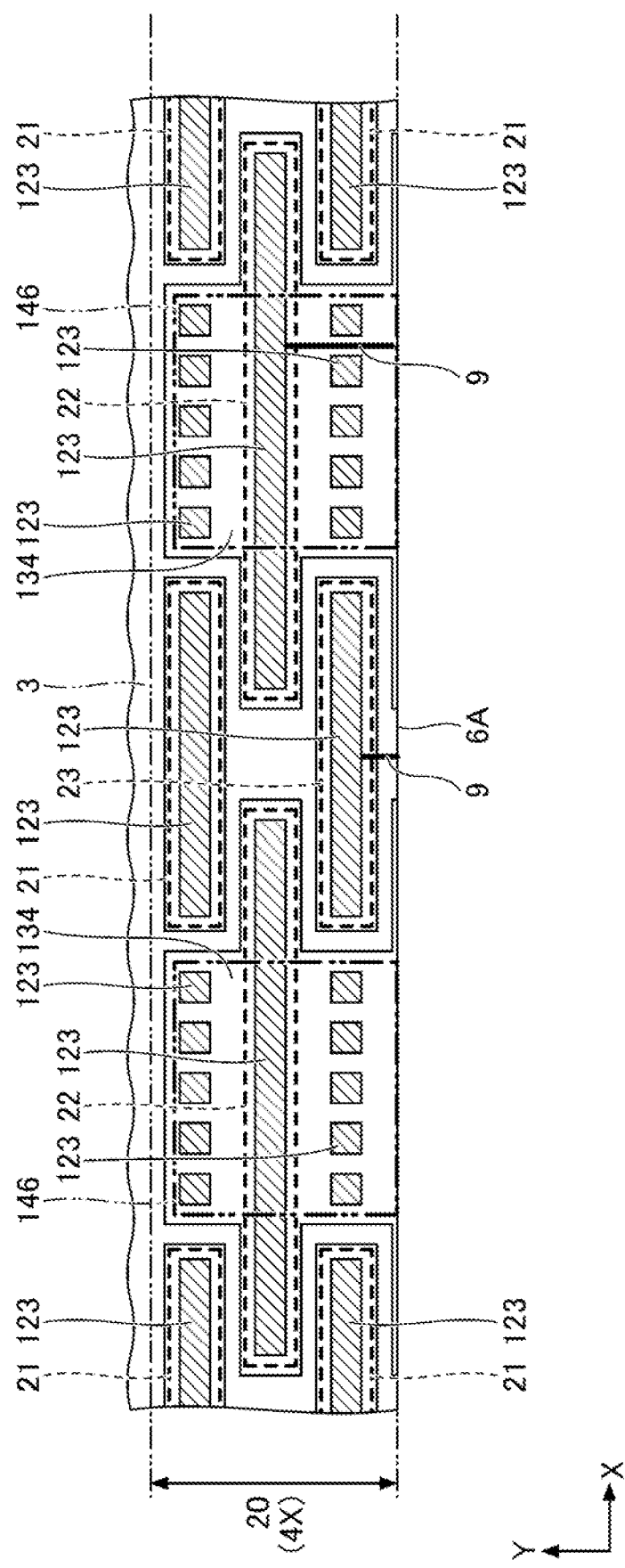
FIG. 17 is a diagram illustrating a layout of the scribe region after separation in the Third Variation of the First Embodiment.

FIG. 17 is a diagram illustrating a layout of the scribe region 4X after separation in the Third Variation of the First Embodiment. Similar to the First Embodiment, the remaining portions of the scribe regions 4X and 4Y substantially match a corresponding one of the second regions 20, as illustrated in FIG. 17. In other words, a trench-via wall composed of multiple trench vias is provided continuously along the entirety of the remaining portion of the scribe region 4X as viewed in the Y-direction. Likewise, a trench-via wall composed of multiple trench regions is provided continuously along the entirety of the remaining portion of the scribe region 4Y as viewed in the X-direction.

The Third Variation of the First Embodiment can provide substantially the same effects as those in the First Embodiment.

Second Embodiment

Figure 18:
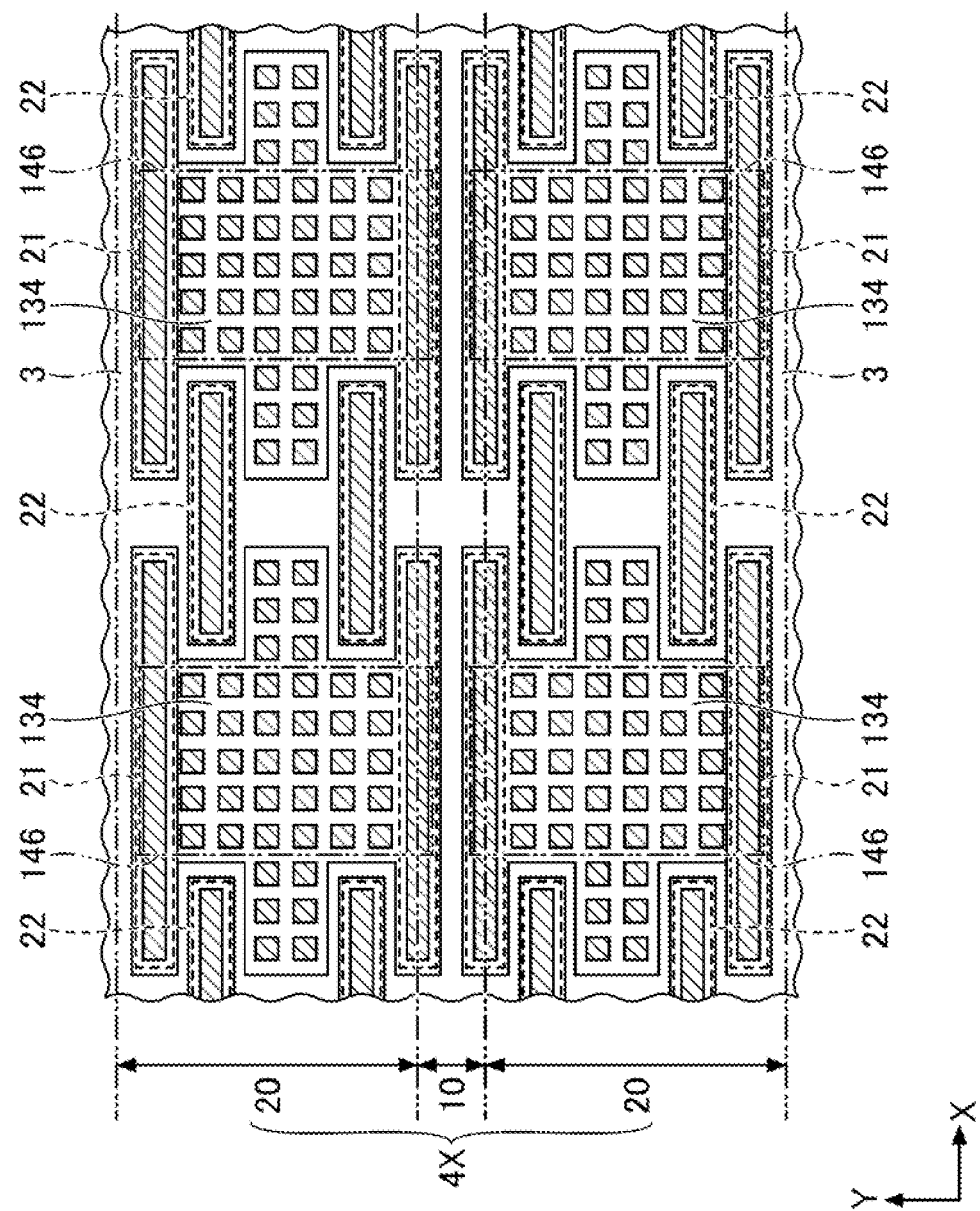
FIG. 18 is a schematic diagram illustrating a layout of a scribe region in a Second Embodiment.

Next, the Second Embodiment is described. The Second Embodiment is different from the First Embodiment mainly in terms of the number of electrode pads arranged in the widthwise direction of the scribe region. FIG. 18 illustrates a schematic diagram illustrating a layout of the scribe region 4X in the Second Embodiment.

In the Second Embodiment, multiple electrode pads 5 (see FIG. 2) are placed so as to be aligned in two rows in the Y-direction within the scribe region 4X, and in accordance with this, openings 146 are formed so as to be aligned in two rows in the Y-direction in the cover film 116. The conductive film 134 and the like are formed similarly to those in the First Embodiment so as to correspond with the respective openings 146.

In the Second Embodiment as well, the scribe region 4Y has the same configuration as the scribe region 4X, except for the fact that the orientations of each of the constituent elements in the first region 10, the second regions 20, and the like are different.

The other aspects of the configuration are the same as those in the First Embodiment.

In the scribe region 4X after separation, the remaining portions of the scribe region 4X and 4Y substantially match a corresponding one of the second regions 20. In other words, a trench-via wall composed of multiple trench vias is provided continuously along the entirety of the remaining portion of the scribe region 4X as viewed in the Y-direction. Likewise, a trench wall composed of multiple trench vias is provided continuously along the entirety of the remaining portion of the scribe region 4Y as viewed in the X-direction. Alternatively, the trench-via wall may be provided along only a portion of the remaining portion of the scribe region 4X or along only a portion of the remaining portion of the scribe region 4Y.

According to the Second Embodiment, cracking propagation can be suppressed more effectively because more trench vias are provided.

First Variation of Second Embodiment

Figure 19:
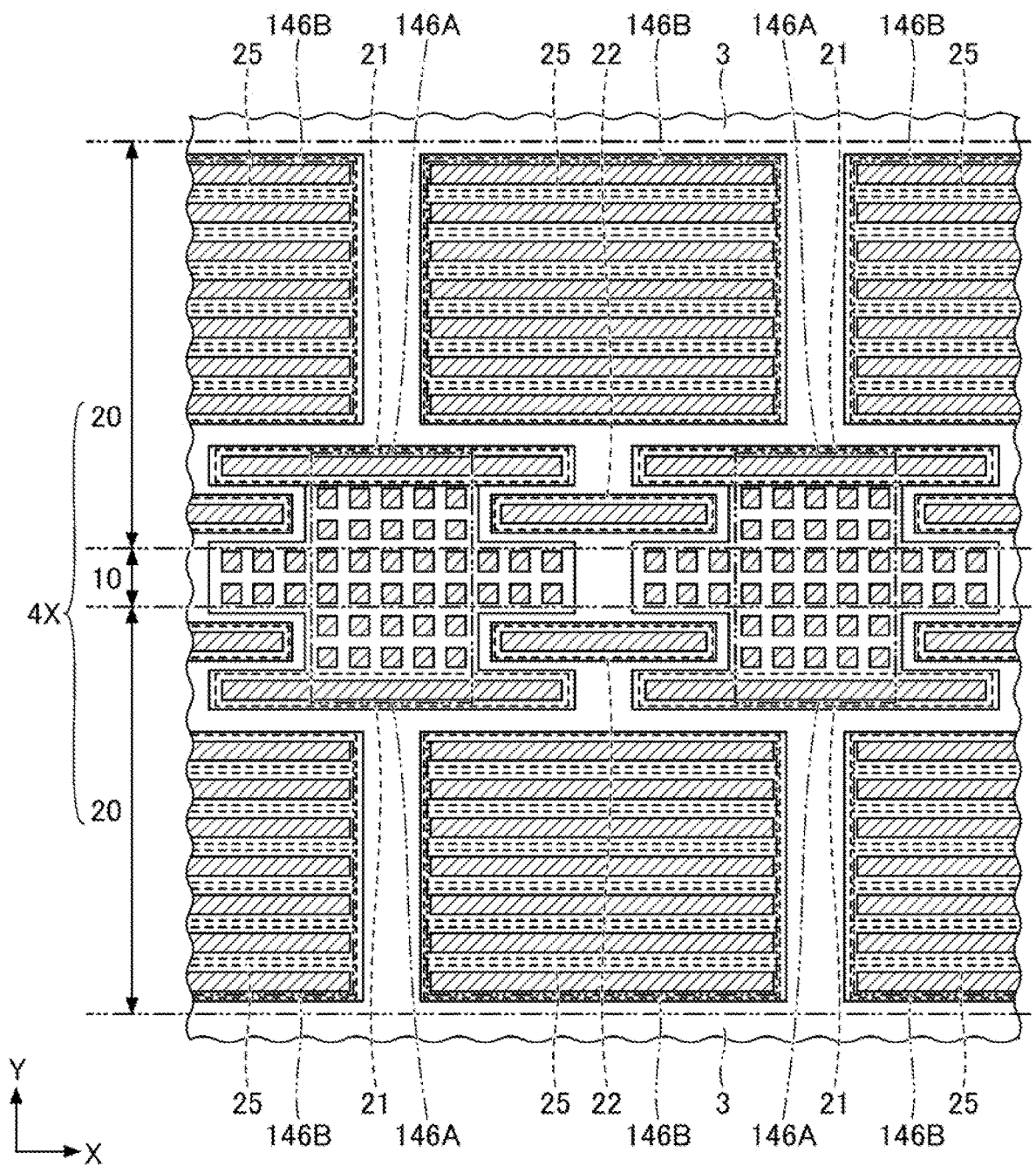
FIG. 19 is a schematic diagram illustrating a layout of a scribe region in a First Variation of the Second Embodiment.

Next, the First Variation of the Second Embodiment is described. The First Variation differs from the First Embodiment mainly in terms of the number of electrode pads arranged in the widthwise direction of the scribe region. FIG. 19 is a schematic diagram illustrating a layout of the scribe region 4X in the First Variation of the Second Embodiment.

In the First Variation, multiple electrode pads 5 (see FIG. 2) are placed so as to be aligned in three rows in the Y-direction within the scribe region 4X, and in accordance with this, openings 146 (146A and 146B) are formed so as to be aligned in three rows in the Y-direction in the cover film 116. The conductive film 134 and the like are formed similarly to those in the First Embodiment so as to correspond to the opening 146A situated in the middle row among the openings 146 aligned in three rows in the Y-direction. Also, multiple fifth trench vias 25 extending in the X-direction are formed so as to correspond with respective openings 146B situated on the outer sides among the three rows of the openings 146 aligned in the Y-direction. The fifth trench via 25 includes a cross-sectional configuration substantially the same as that of the first trench via 21. Multiple fifth trench vias 25 are arranged so as to be aligned in the Y-direction with respect to a single opening 146B.

In the First Variation as well, the scribe region 4Y has a configuration that is the same as the scribe region 4X, except for the fact that the orientations of each of the constituent elements in the first region 10, the second regions 20, and the like are different.

The other aspects of the configuration are the same as those in the First Embodiment.

According to the First Variation of the Second Embodiment, cracking propagation can be suppressed more effectively because more trench vias are provided.

Second Variation of Second Embodiment

Figure 20:
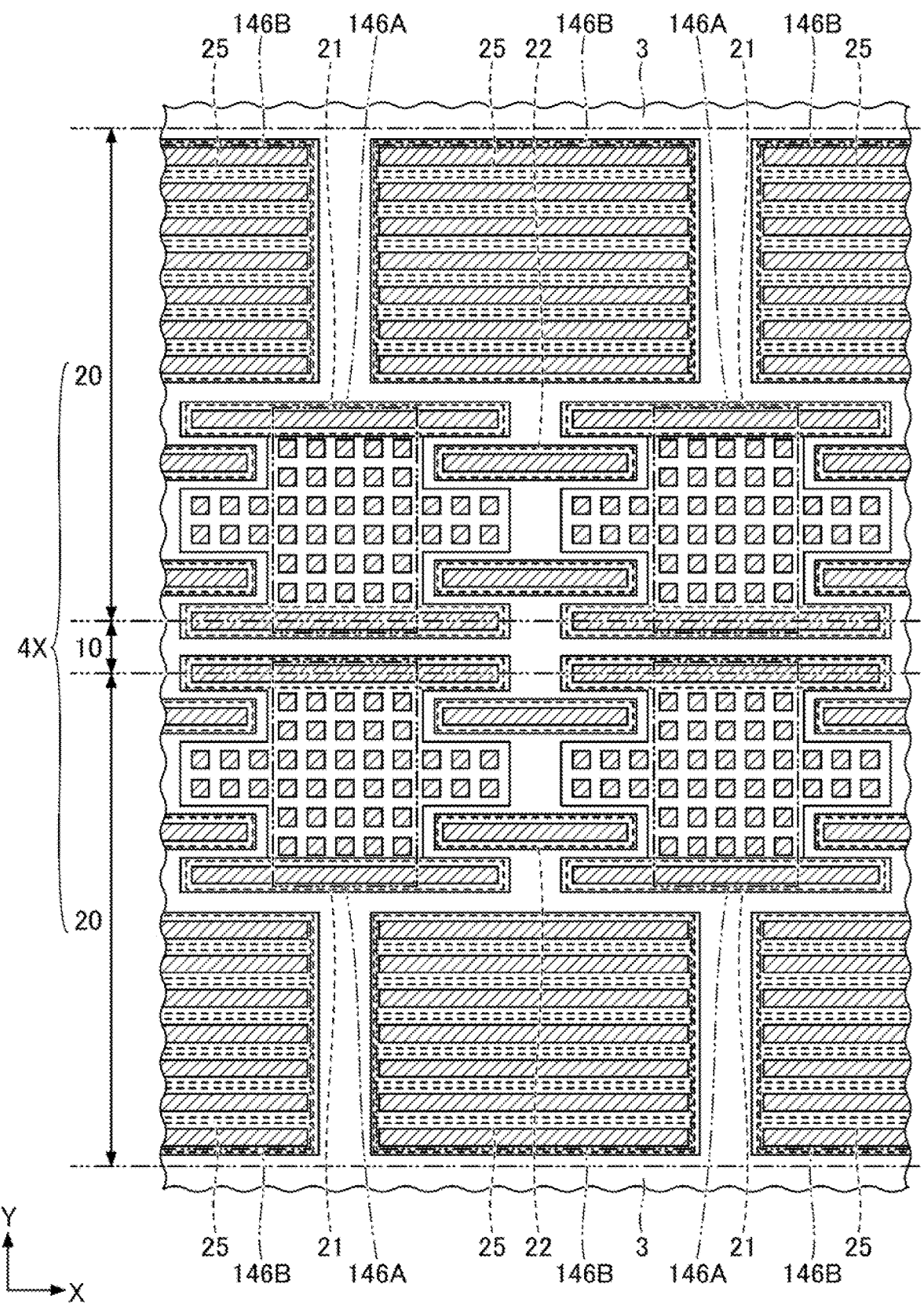
FIG. 20 is a schematic diagram illustrating a layout of a scribe region in a Second Variation of the Second Embodiment.

Next, the Second Variation of the Second Embodiment is described. The Second Embodiment differs from the First Embodiment mainly in terms of the number of electrode pads arranged in the widthwise direction of the scribe region. FIG. 20 is a schematic diagram illustrating a layout of the scribe region 4X in the Second Variation of the Second Embodiment.

In the Second Variation, multiple electrode pads 5 (see FIG. 2) are placed so as to be aligned in four rows in the Y-direction within the scribe region 4X, and in accordance with this, openings 146 (146A and 146B) are formed so as to be aligned in four rows in the Y-direction in the cover film 116. The conductive film 134 and the like are formed similar to those in the First Embodiment so as to correspond with respective openings 146A of two rows situated in the middle among the four rows of openings 146 aligned in the Y-direction. Also, multiple fifth trench vias 25 extending in the X-direction are formed so as to correspond with respective openings 146B situated on the outer sides among the four rows of the openings 146 aligned in the Y-direction. Multiple fifth trench vias 25 are arranged so as to be aligned in the Y-direction with respect to a single opening 146B.

In the Second Variation as well, the scribe region 4Y has a configuration that is the same as the scribe region 4X, except for the fact that the orientations of each of the constituent elements in the first region 10, the second regions 20, and the like are different.

The other aspects of the configuration are the same as those in the First Embodiment.

According to the Second Variation of the Second Embodiment, cracking propagation can be suppressed more effectively because more trench vias are provided.

Third Variation of Second Embodiment

Figure 21:
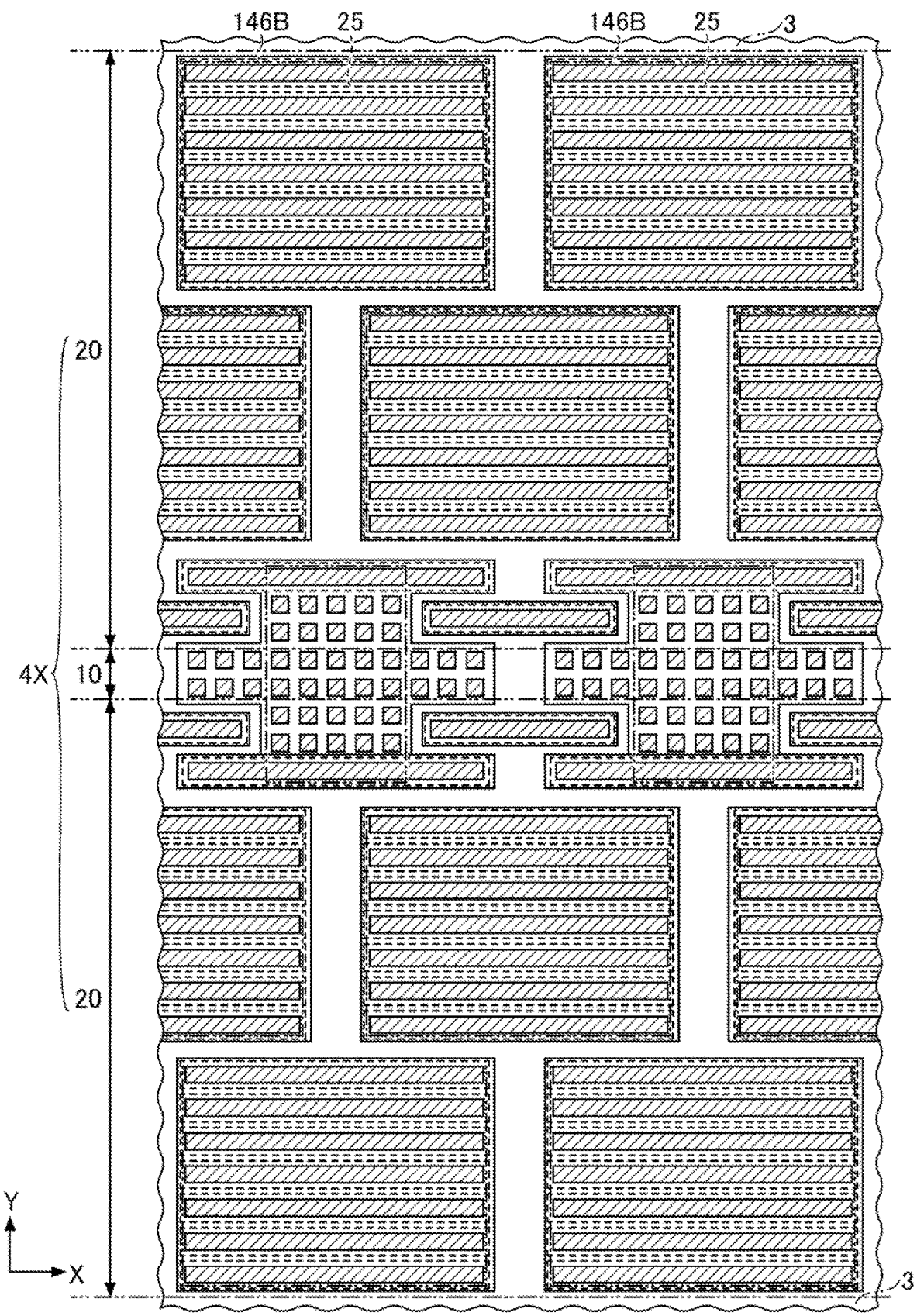
FIG. 21 is a schematic diagram illustrating a layout of a scribe region in a Third Variation of the Second Embodiment.

Next, the Third Variation of the Second Embodiment is described. The Third Variation differs from the First Embodiment mainly in terms of the number of electrode pads arranged in the widthwise direction of the scribe region. FIG. 21 is a schematic diagram illustrating a layout of the scribe region 4X in the Third Variation of the Second Embodiment.

In the Third Variation, multiple electrode pads 5 (see FIG. 2) are formed so as to be aligned in five rows in the Y-direction within the scribe region 4X, and in accordance with this, openings 146 (146A and 146B) are formed so as to be aligned in five rows in the Y-direction in the cover film 116. The conductive film 134 and the like are formed similar to those in the First Embodiment so as to correspond to the opening 146A situated in the middle row among the openings 146 aligned in five rows in the Y-direction. Also, multiple fifth trench vias 25 are formed in the X-direction so as to correspond with respective openings 146B situated in the outer two rows on each outer side among the five rows of the openings 146 aligned in the Y-direction. Multiple fifth trench vias 25 are arranged so as to be aligned in the Y-direction with respect to a single opening 146B.

In the Third Variation as well, the scribe region 4Y has a configuration that is the same as the scribe region 4X, except for the fact that the orientations of each of the constituent elements in the first region 10, the second regions 20, and the like are different.

The other aspects of the configuration are the same as those in the First Embodiment.

According to the Third Variation of the Second Embodiment, cracking propagation can be suppressed more effectively because more trench vias are provided.

Third Embodiment

Figure 22:
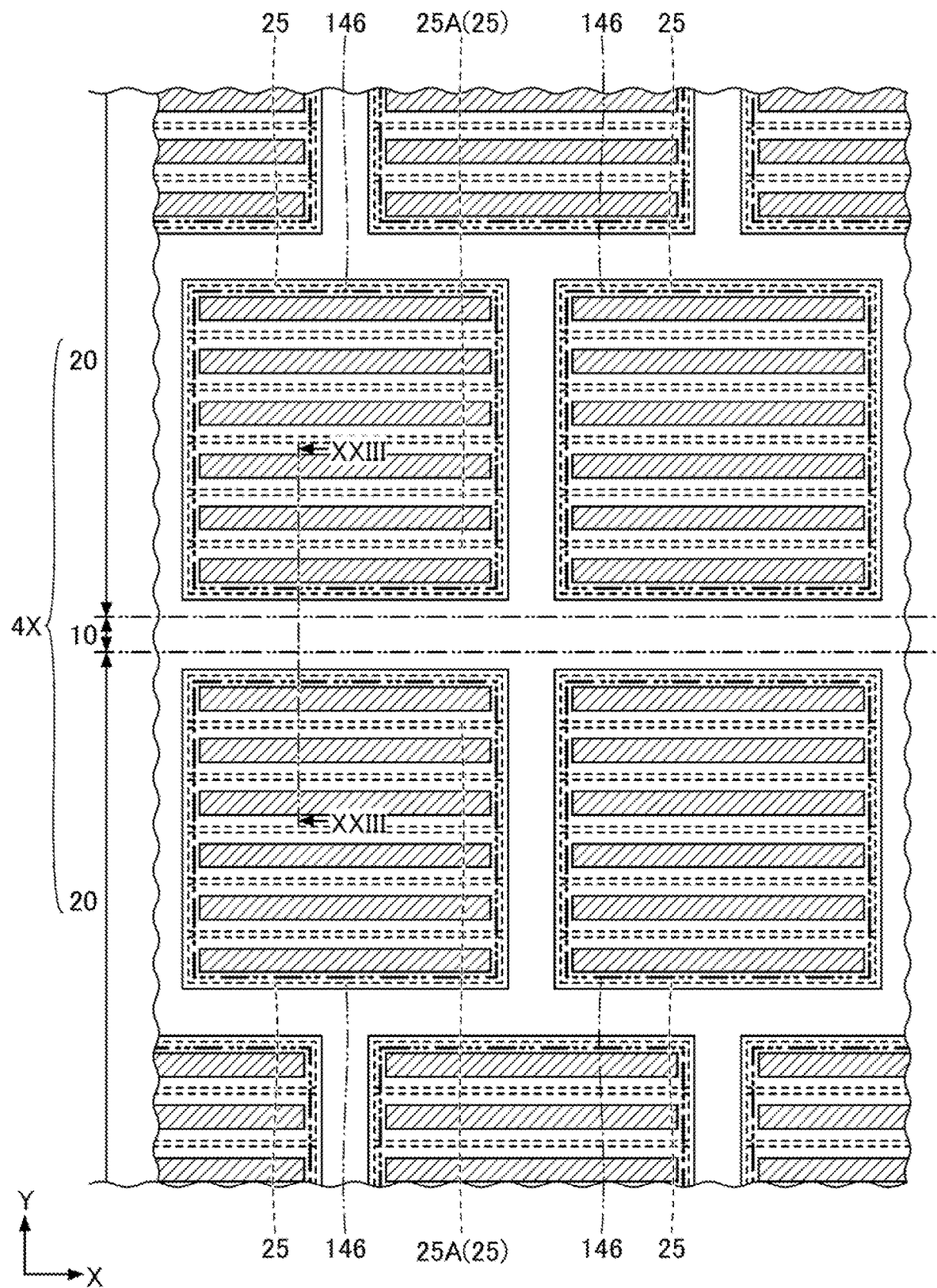
FIG. 22 is a schematic diagram illustrating a layout of a scribe region in a Third Embodiment.
Figure 23A:
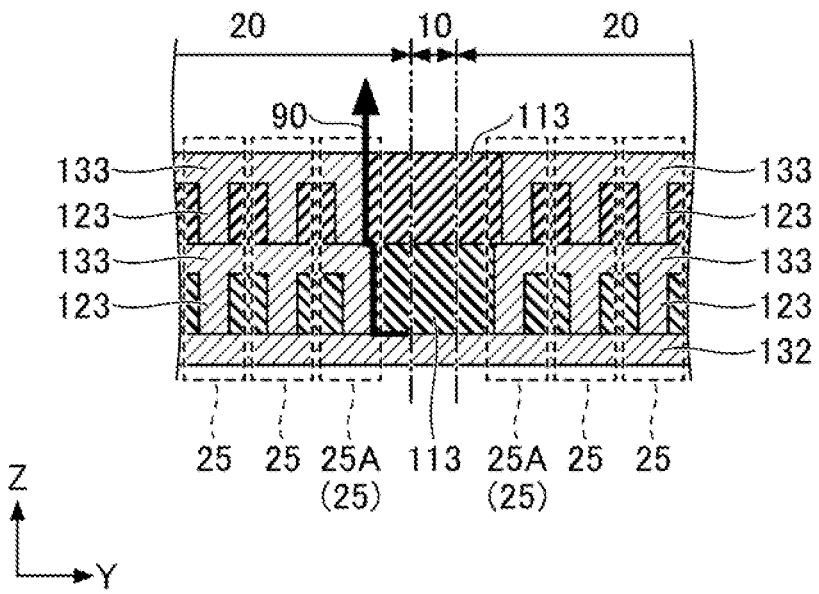
FIG. 23A and FIG. 23B are cross-sectional views illustrating the scribe region in the Third Embodiment.
Figure 23B:
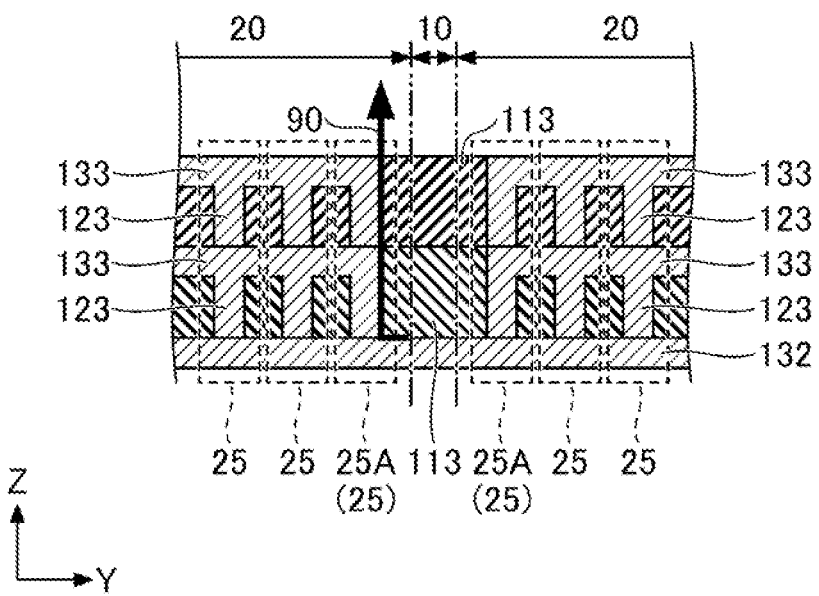

Next, the Third Embodiment is described. The Third Embodiment differs from the First Embodiment mainly in terms of the cross-sectional configuration of the trench vias. FIG. 22 is a schematic diagram illustrating a layout of the scribe region 4X in the Third Embodiment. FIG. 23A and FIG. 23B are cross-sectional views illustrating the scribe region 4X in the Third Embodiment. FIG. 23A and FIG. 23B correspond to a cross-sectional view taken along XXIII-XXIII line of FIG. 22.

The scribe region 4X in the Third Embodiment is provided with the regions illustrated in FIG. 22 and FIGS. 23A and 23B, and these regions may be used in combination with the regions of the First Embodiment, the variations of the First Embodiment, the Second Embodiment, or the variations of the Second Embodiment. In each of the openings 146 formed in the second regions 20 within the regions illustrated in FIG. 22 and FIGS. 23A and 23B, the configuration of a fifth trench via 25A that is situated closest to the first region 10 among the fifth trench vias 25 provided beneath the electrode pad 5 exposed from the corresponding opening 146 is different from the configuration of the other fifth trench vias 25. FIG. 23A and FIG. 23B illustrate two examples with respect to the configuration of the fifth trench via 25A. FIG. 23A and FIG. 23B illustrate only a portion of the scribe region 4X in the Z-direction. Illustrations of the first interlayer insulation film 111 and the like formed beneath the wiring film 132 as well as the third interlayer insulation films 113 and the like formed above the two wiring films 133 are omitted.

In the first example illustrated in FIG. 23A, the positions of the multiple vias 123 included in the fifth trench via 25A are arranged such that a via 123 is greater in distance to the first region 10, the further the via 123 is in the +Z-direction (the greater the distance is from the via 123 to the substrate 101). Also, the side surface, facing the first region 10, of the wiring film 133 is flush with side surface, facing the first region 10, of the via 123 situated directly beneath the wiring film 133. Also, the side surface, facing a side opposite to the chip region 3, of the fifth trench via 25A, becomes closer to the chip region 3 as the distance from the substrate increases. With such a configuration, in a case where, for example, cracking 90 propagates along the surface of the wiring film 132, the cracking 90 is hindered from propagating in the Y-direction by the via 123. Even in a case where the cracking 90 propagates further, since the cracking 90 readily propagates along the side surface of the vias 123 and the wiring films 133 toward the +Z-direction, cracking 90 tends not to propagate in the Y-direction. Hence, even when propagation of the cracking 90 advances caused by a significant force, the cracking 90 is suppressed from reaching the chip region 3 (see FIG. 2).

In the second example illustrated in FIG. 23B, the side surfaces, facing the first region 10, of the vias 123 included in the fifth trench via 25A are flush with the side surfaces, facing the first region 10, of the wiring films 133. With such a configuration, in a case where, for example, cracking 90 propagates along the surface of the wiring film 132, the cracking 90 is hindered from propagating in the Y-direction by the via 123. Even in a case where the cracking 90 propagates further, since the cracking 90 readily propagates along the side surface of the vias 123 and the wiring films 133 toward the +Z-direction, cracking tends not to propagate in the Y-direction. Hence, even when propagation of the cracking 90 advances caused by a significant force, the cracking 90 is suppressed from reaching the chip region 3 (see FIG. 2).

In the Third Embodiment as well, the scribe region 4Y has a configuration that is the same as the scribe region 4X, except for the fact that the orientations of each of the constituent elements in the first region 10, the second regions 20, and the like are different.

The other aspects of the configuration are the same as those in the First Embodiment.

According to the Third Embodiment, cracking propagation can be suppressed more effectively because the fifth trench vias 25A are provided.

Variation of Third Embodiment

Figure 24:
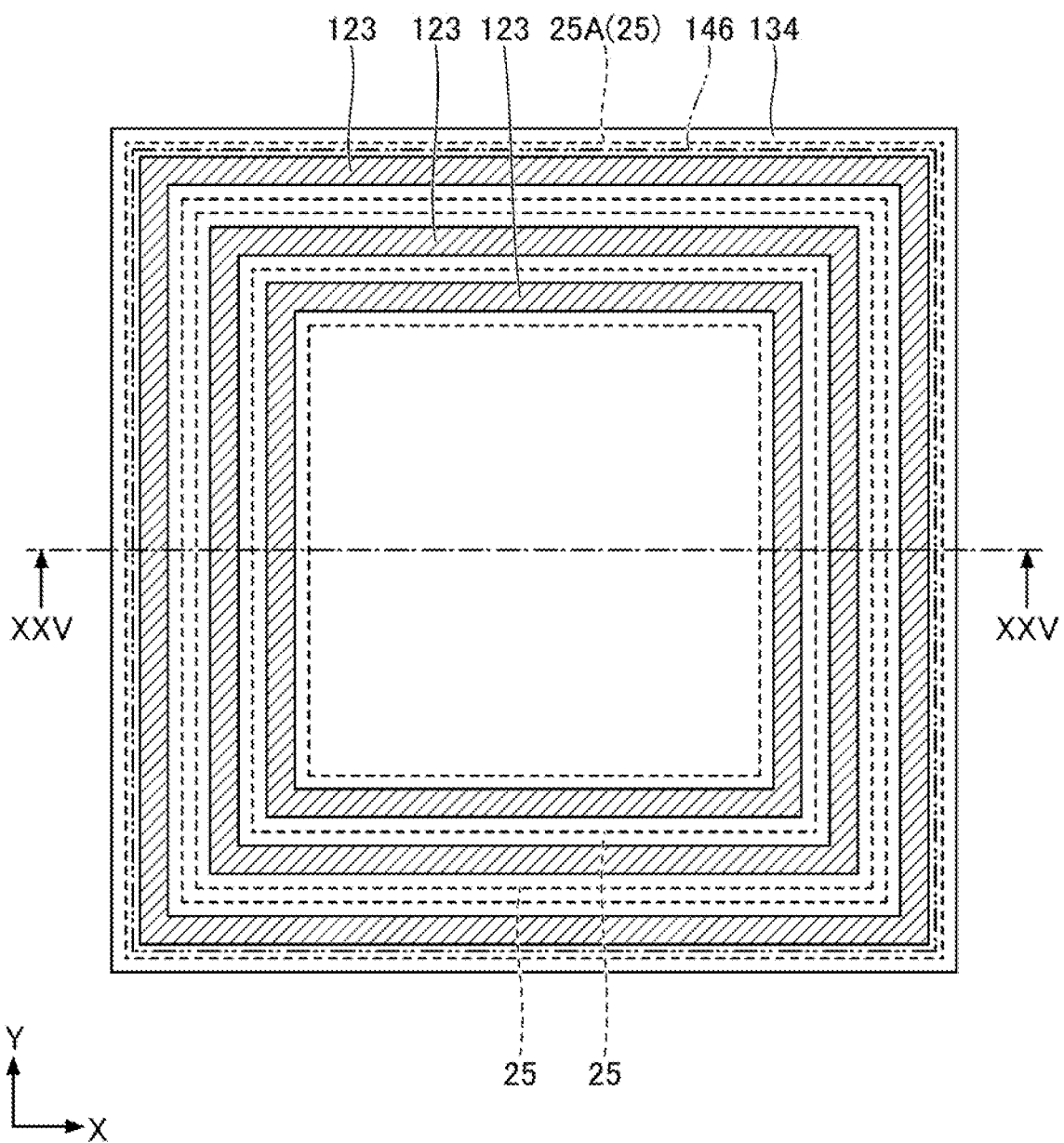
FIG. 24 is a schematic diagram illustrating a layout of an electrode pad in a variation of the Third Embodiment.

Next, the variation of the Third Embodiment is described. The variation differs from the Third Embodiment mainly in terms of the trench via layout. FIG. 24 is a schematic diagram illustrating a layout of an electrode pad in the variation of the Third Embodiment. FIG. 25A and FIG. 25B are cross-sectional views illustrating the electrode pad in the variation of the Third Embodiment. FIG. 25A and FIG. 25B correspond to a cross-sectional view taken along XXV-XXV line of FIG. 24.

In the variation of the Third Embodiment, the opening 146 is formed as a square, and the fifth trench vias 25 including the fifth trench via 25A are formed annularly on the inside of the opening 146 as viewed in a plan view.

In a first example illustrated in FIG. 25A, the positions of the multiple vias 123 included in the fifth trench via 25A are arranged such that a via 123 is greater in distance to the first region 10, the further the via 123 is in +Z-direction (the greater the distance is from the via 123 to the substrate 101). Also, the side surface, facing the first region 10, of the wiring film 133 is flush with the side surface, facing the first region 10, of the via 123 situated directly beneath the wiring film 133. With such a configuration, even when propagation of the cracking 90 advances caused by a significant force, the cracking 90 is suppressed from reaching the chip region 3 (see FIG. 2).

In the second example illustrated in FIG. 25B, the side surfaces, facing the first region 10, of the vias 123 included in the fifth trench via 25A are flush with the side surfaces, facing the first region 10, of the wiring films 133. With such a configuration, even when propagation of the cracking 90 advances caused by a significant force, the cracking 90 is suppressed from reaching the chip region 3 (see FIG. 2).

In the variation as well, the scribe region 4Y, has a configuration that is the same as the scribe region 4X, except for the fact that the orientations of each of the constituent elements in the first region 10 and in the second regions 20, for example, are different.

The other aspects of the configuration are the same as those in the Third Embodiment.

According to the variation of the Third Embodiment, cracking propagation can be suppressed more effectively because the fifth trench vias 25A are provided. Also, the electrode pad in the variation of the Third Embodiment can be arranged in the scribe region 4Y as is even without modifying the layout.

A configuration that is the same as the fifth trench vias 25A in the Third Embodiment or the variation can be applied to the first to fourth trench vias 21 to 24. That is, a configuration may be provided such that the entirety of the top surface (surface on the side opposite from the side nearest to the substrate 101) of the film constituting these trench vias is visible from above top surface of the substrate 101.

Further, the present invention is not limited to these embodiments, but various variations and modifications may be made without departing from the scope of the present invention.

What is claimed is:

1. A semiconductor wafer comprising:
   chip regions; and
   a scribe region provided between the chip regions, the scribe region extending in a first direction in a plan view,
   wherein the scribe region includes:
      a first region extending in the first direction,
      second regions situated on respective sides of the first region in a second direction perpendicular to the first direction in a plan view, each of the second regions extending in the first direction, and
      an electrode pad provided in at least the second regions, and
   each of the second regions includes one or more trench vias that are wall-shaped, the one or more trench vias extending in the first direction, and at least one trench via of the one or more trench vias having a portion overlapping with the electrode pad in a plan view.

2. The semiconductor wafer according to claim 1, wherein an entirety of the one or more trench vias extends along one of the second regions as viewed in the second direction.

3. The semiconductor wafer according to claim 2, comprising a plurality of said trench vias, wherein the trench vias include:
   first trench vias each aligned in the first direction, and
   second trench vias each aligned in the first direction, the second trench vias being provided in a different location than the first trench vias in the second direction, and
   wherein at least a portion of one of the first trench vias overlaps with at least a portion of one of the second trench vias as viewed in the second direction.

4. The semiconductor wafer according to claim 1, further comprising a substrate, wherein the trench via includes metal films stacked one upon another on the substrate.

5. The semiconductor wafer according to claim 4, wherein a side surface, facing the first region, of the trench via is greater in distance to the first region, the further the side surface is from the substrate.

6. The semiconductor wafer according to claim 1 wherein the scribe region includes a plurality of said electrode pads, the plurality of electrode pads being aligned in the second direction.

7. A semiconductor device comprising:
   a chip region; and
   a scribe region provided on a side of the chip region, the scribe region extending in a first direction in a plan view,
   wherein the scribe region includes:
      a plurality of electrode pads, and
      a plurality of trench vias that are wall-shaped, the plurality of trench vias extending in the first direction, and at least one trench via of the plurality of trench vias having a portion overlapping with one of the electrode pads in a plan view, and another trench via of the plurality of trench vias having a portion located between the plurality of electrode pads.

8. The semiconductor device according to claim 7, wherein the plurality of trench vias extend along the scribe region as viewed in a second direction that is perpendicular to the first direction in a plan view.

9. The semiconductor device according to claim 8, wherein the plurality of trench vias include:
   first trench vias each aligned in the first direction, and
   second trench vias each aligned in the first direction, the second trench vias being provided in a different location than the first trench vias in the second direction, and
   wherein at least a portion of one of the first trench vias overlaps with at least a portion of one of the second trench vias as viewed in the second direction.

10. The semiconductor device according to claim 8, wherein the plurality of electrode pads being aligned in the second direction.

11. The semiconductor device according to claim 7, further comprising a substrate, wherein the trench via includes metal films stacked one upon another on the substrate.

12. The semiconductor device according to claim 11, wherein a side surface, facing a side opposite to the chip region, of the trench via becomes closer to the chip region as distance from the substrate increases.

* * * * *